US005631554A

United States Patent [19]
Briese et al.

[11] Patent Number: 5,631,554
[45] Date of Patent: May 20, 1997

[54] ELECTRONIC METERING DEVICE INCLUDING AUTOMATIC SERVICE SENSING

[75] Inventors: Forrest W. Briese, Norcross, Ga.; Christophe J. A. Fouquet, Central, S.C.; Coy S. Lowe, Talking Rock, Ga.; Charles C. Hyder, Atlanta, Ga.; John M. Schlarb, Atlanta, Ga.

[73] Assignee: Schlumberger Industries, Inc., Norcross, Ga.

[21] Appl. No.: 509,367

[22] Filed: Jul. 31, 1995

Related U.S. Application Data

[63] Continuation-in-part of Ser. No. 37,938, Mar. 26, 1993, Pat. No. 5,469,049.

[51] Int. Cl.[6] .............................. G01R 1/06; G01R 21/06
[52] U.S. Cl. ........................................ 324/76.77; 324/142
[58] Field of Search ................................ 364/571, 483; 324/142, 76.77, 141

[56] References Cited

U.S. PATENT DOCUMENTS

| | | | |
|---|---|---|---|
| 4,200,933 | 4/1980 | Nickel et al. | 364/571 |
| 4,884,021 | 11/1989 | Hammond et al. | 324/142 |
| 4,977,515 | 12/1990 | Rudden et al. | 364/492 |
| 4,979,122 | 12/1990 | Davis et al. | 364/483 |
| 5,059,896 | 10/1991 | Gerner et al. | 324/142 |
| 5,302,890 | 4/1994 | McEachern et al. | 324/142 |

*Primary Examiner*—Kenneth A. Wieder
*Assistant Examiner*—Barry C. Bowser
*Attorney, Agent, or Firm*—Leonard W. Pojunas

[57] ABSTRACT

An integral electronic meter system diagnostics package including a microprocessor, storage memory, pre-select series of system diagnostic tests, and recording any results which exceed predefined programmable thresholds, and display means for displaying error and/or diagnostic messages identifying selected diagnostic data and/or errors discovered in the meter tests during a predefined period. The system automatically senses the type of electrical service in which the meter is installed.

12 Claims, 25 Drawing Sheets

| DESCRIPTION | DISPLAY |
|---|---|
| PHASE A VOLTAGE ANGLE | PhA $0.0°$ U |
| PHASE A VOLTAGE | PhA $120.0$ U |
| PHASE A CURRENT ANGLE | PhA $10.2°$ A |
| PHASE A CURRENT | PhA $81.2$ A |
| PHASE B VOLTAGE ANGLE | PhB $119.7°$ U |
| PHASE B VOLTAGE | PhB $121.5$ U |
| PHASE B CURRENT ANGLE | PhB $134.5°$ A |
| PHASE B CURRENT | PhB $85.5$ A |
| PHASE C VOLTAGE ANGLE | PhC $240.3°$ U |
| PHASE C VOLTAGE | PhC $119.8$ U |
| PHASE C CURRENT ANGLE | PhC $232.6°$ A |
| PHASE C CURRENT | PhC $52.7$ A |
| NO. OF DIAGNOSTIC 1 ERRORS | d1 $008$ |
| NO. OF DIAGNOSTIC 2 ERRORS | d2 $000$ |
| NO. OF DIAGNOSTIC 3 ERRORS | d3 $013$ |
| NO. OF DIAGNOSTIC 4 ERRORS | d4 $101$ |
| NO. OF DIAGNOSTIC 5 ERRORS | d5 $102$ |

FIG.14

ELECTRONIC METERING DEVICE INCLUDING AUTOMATIC SERVICE SENSING

CROSS-REFERENCE TO RELATED APPLICATION

This application is a continuation-in-part of Ser. No. 08/037,938, now U.S. Pat. No. 5,469,049, for "System Checking and Troubleshooting Package for an Electric Metering Device," filed Mar. 26, 1993.

TECHNICAL FIELD

The present invention relates to an integral method and apparatus for conducting system installation diagnostics in a solid state electronic meter.

BACKGROUND ART

Induction-type watt hour meters typically employ a pulse initiator which generates pulses in proportion to the rate of rotation of a meter disk. These generated pulses are transmitted to electronic registers for deriving current, voltage, power and/or time of use energy consumption.

Various types of solid state polyphase electronic meters are also in common use today. These meters, which monitor electrical energy consumption and record or report such consumption in kilowatt hours, power factor, KVA, and/or reactive volt amperes, typically employ solid state components, and may utilize analog-to-digital converters to provide digital data rather than pulse data from which various demand/consumption indicators can be extracted.

It is also well known to provide solid state electronic meters which may be configurable for installation in any one of a variety of single or multi-phase electricity distribution systems. One example of a solid state electronic watt hour meter is disclosed in U.S. Pat. No. 5,059,896, issued to Germer et al.

An example of a solid state electricity demand recorder which may be used in conjunction with a conventional watt hour meter is disclosed in U.S. Pat. No. 4,697,182, issued to Swanson.

Various ancillary equipment and diagnostic techniques are utilized by service personnel during installation of these meters in attempting to confirm that the installation has been wired correctly. However, many installation checks, such as polarity and cross-phase checks, are derived on site by field personnel and are therefore dependent upon the knowledge and competence of those personnel.

While various diagnostic equipment is available for use by field personnel during installation and periodic maintenance, a need exists for an integral apparatus which automatically and periodically performs a standard series of system and installation diagnostics without interrupting the operation of the meter. In addition, there is a need for periodic self-checks of the meter to determine and record the occurrence of selected pre-defined fatal and non-fatal errors in the meter's operation.

In addition, although there are meters available which may be adapted for use in more than one type of electrical service, one drawback of these meters is that the customer often must program the service type into the meter prior to installation. This pre-installation programming of multiple service meters tends to limit their multiple service capability.

SUMMARY OF THE INVENTION

An object of the present invention is therefore to provide an integral system checking and troubleshooting package for a solid state electronic meter.

It is another object of the present invention to provide a method and apparatus which is integral with a solid state meter and which automatically performs a series of predefined system installation and diagnostic tests on the meter.

It is still another object of the present invention to provide a system checking and troubleshooting package which supports and is integral to an electronic meter, and which includes means for displaying the results of selected self-checks and system diagnostic tests when interrogated by service personnel.

It is yet another object of the present invention to provide an automated system checking apparatus which periodically checks for the existence of certain pre-defined conditions and which, depending upon the nature of the error, takes predefined action in response to the detection of any such errors.

It is another object of the present invention to provide a method and apparatus for determining the angles of each voltage and current phasor with respect to a preselected base phasor, for the purpose of verifying that all meter elements are sensing and receiving the correct voltage and current for each phase of a multi-phase electric service.

It is yet another object of the present invention to provide a method and apparatus which is integral with the solid-state multiple service meter and which automatically senses the specific type of electrical service after the meter has been installed, and periodically during its operation.

In accordance with the present invention, an integral electronic meter self-checking and system diagnostics package is provided, including a microprocessor, storage memory, logic for automatically and periodically performing a preselected set of meter self-checks and recording any errors therefrom, logic for automatically performing a preselected series of system diagnostics tests, and recording any results which exceed predefined programmable thresholds, and display means for displaying error and/or diagnostic messages identifying, respectively, one or more self-check errors or selected diagnostic data and/or errors discovered in the meter self-checks during a predefined period.

The device of the present invention is preferably integrated into a solid state meter which utilizes an analog-to-digital converter and associated digital sampling techniques to obtain digital data corresponding to current and voltage for one or more phases of a single phase or multi-phase system to which the meter is connected.

The present invention automatically performs the preselected meter self-checks, preferably once per day, and/or when power is restored to the meter following an outage, and/or when a full meter reconfiguration is performed, to verify the continued functionability of selected meter components. In the preferred embodiment, for example, the device of the present invention checks its own memory, microprocessor, and selected registers in the meter to determined whether the billing data has been corrupted since the last check. Since the corruption of billing data is considered a fatal error of the meter, the device of the present invention would generate and display an error code indicating the nature of the error, lock the display on the error code, and cease all meter functions (except communications functions) until the meter is re-configured.

In addition, the device also periodically checks for other, non-fatal, errors such as for register overflows, clock, time of use, reverse power flow, and low battery errors. The frequency of error checking may vary depending upon the component and/or condition checked, as well as the potential effect of the error on the continued operation of the meter. Once discovered, non-fatal errors may or may not lock out the display depending upon the nature of the error and how the particular meter is configured.

The present invention also periodically performs a series of preselected system diagnostics tests. These tests are at installation of the meter and preferably about once every five seconds during the normal operation of the meter. In the preferred embodiment, the device conducts a polarity, cross-phase and energy flow diagnostic, a phase voltage deviation diagnostic, an inactive phase current diagnostic, a per-phase power factor diagnostic, and a current waveform distortion detection diagnostic utilizing factory-defined parameters as well as user-defined parameters which may be specified by personnel in the field at installation.

In conducting the polarity, cross-phase and energy flow diagnostic, the device of the present invention utilizes accumulated current and voltage information to determine the phase angle of each voltage and current phasor (for example $V_B$, $V_C$, $I_A$, $I_B$, and $I_C$) with respect to a reference phasor (for example $V_A$) in a multi-phase system. The proper position of each phasor for this installation is pre-defined and used as an exemplar for comparison to the calculated phase angle to determine whether each angle falls within a pre-defined envelope. If any one of the calculated phase angles falls outside its corresponding pre-defined envelope, a diagnostic error message may be displayed. This diagnostic is particularly useful at installations since this error may indicate cross-phasing of a voltage or current circuit, incorrect polarity of a voltage or current circuit, reverse energy flow of one or more phases (co-generation), or an internal meter measurement malfunction.

The device of the present invention also preferably includes a "Toolbox" display which, when manually activated by field personnel, causes the display to scroll through a list of preselected values, such as voltage and current for each phase, the angles associated with each voltage and current phasor, and the numbers of occurrences of each diagnostic failure, for review by field personnel.

In one embodiment of the present invention, the device of the present invention automatically senses the type of electrical service (i.e., Single phase, three-wire Delta, four-wire Wye, or four-wire Delta) when the meter is installed, after a power-up, and also, preferably, periodically during the normal operation of the meter.

The system diagnostics, Toolbox display, and automatic service sensing functions are performed by the device of the present invention without interruption in the operation of the meter except when such operation is purposely suspended as a result of a fatal error.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 14 is a list of the items displayed in the Toolbox display;

FIG. 18B is the second portion of a block schematic of the register module 48 of FIG. 3;

BEST MODE OF OPERATION

Figure 1:
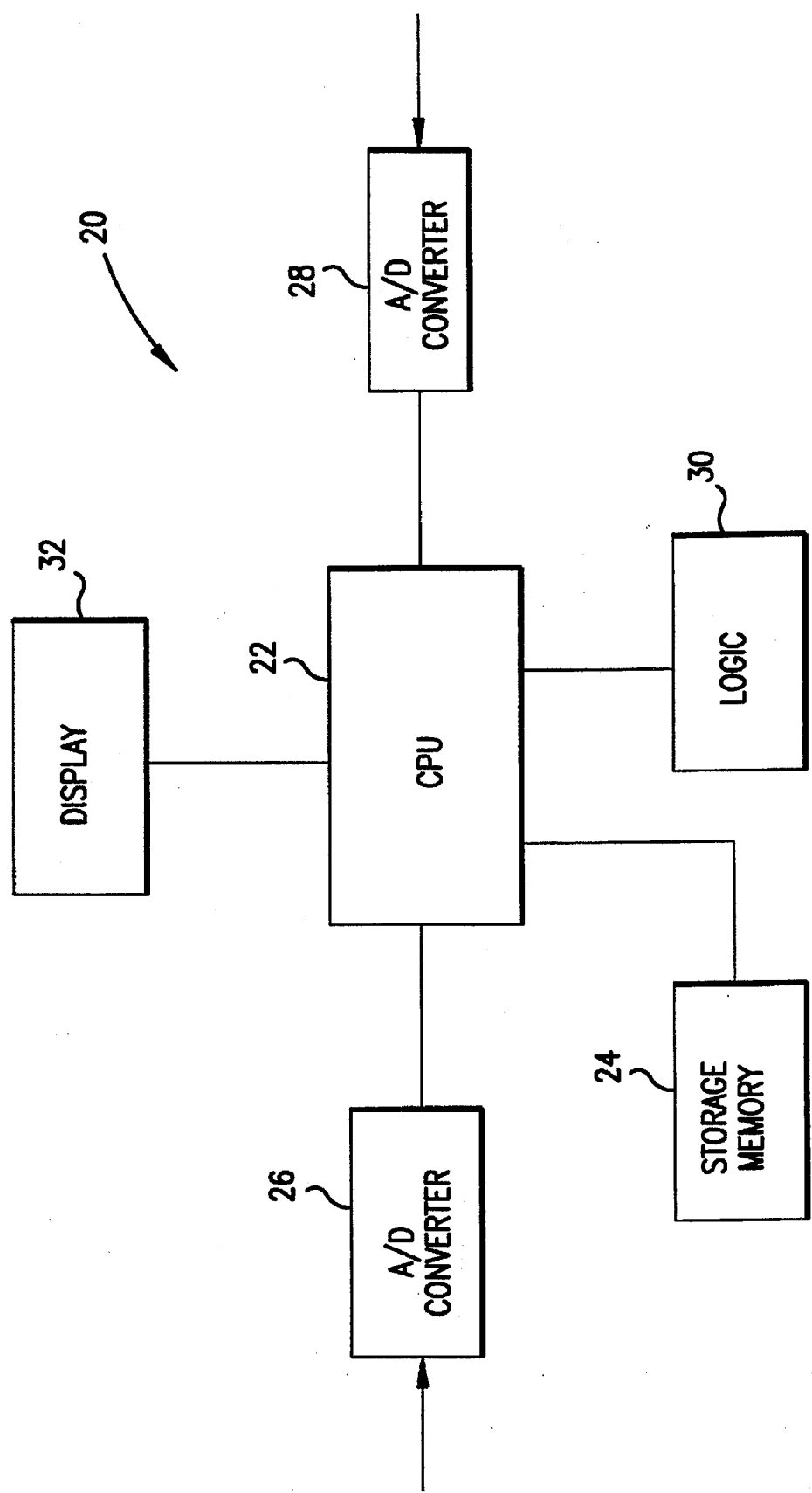
FIG. 1 is a block diagram of the system.

Referring to FIG. 1, the system of the present invention, generally designated as 20, includes a central processing unit 22, storage memory 24 adequate for storing digital data corresponding to the periodic samples of the voltage and current data from the voltage A/D converter 26 and current A/D converter 28, respectively, logic 30 for performing the meter self-check and system and installation diagnostics supported by the system, and display means 32 for displaying error and diagnostic information.

Figure 2:
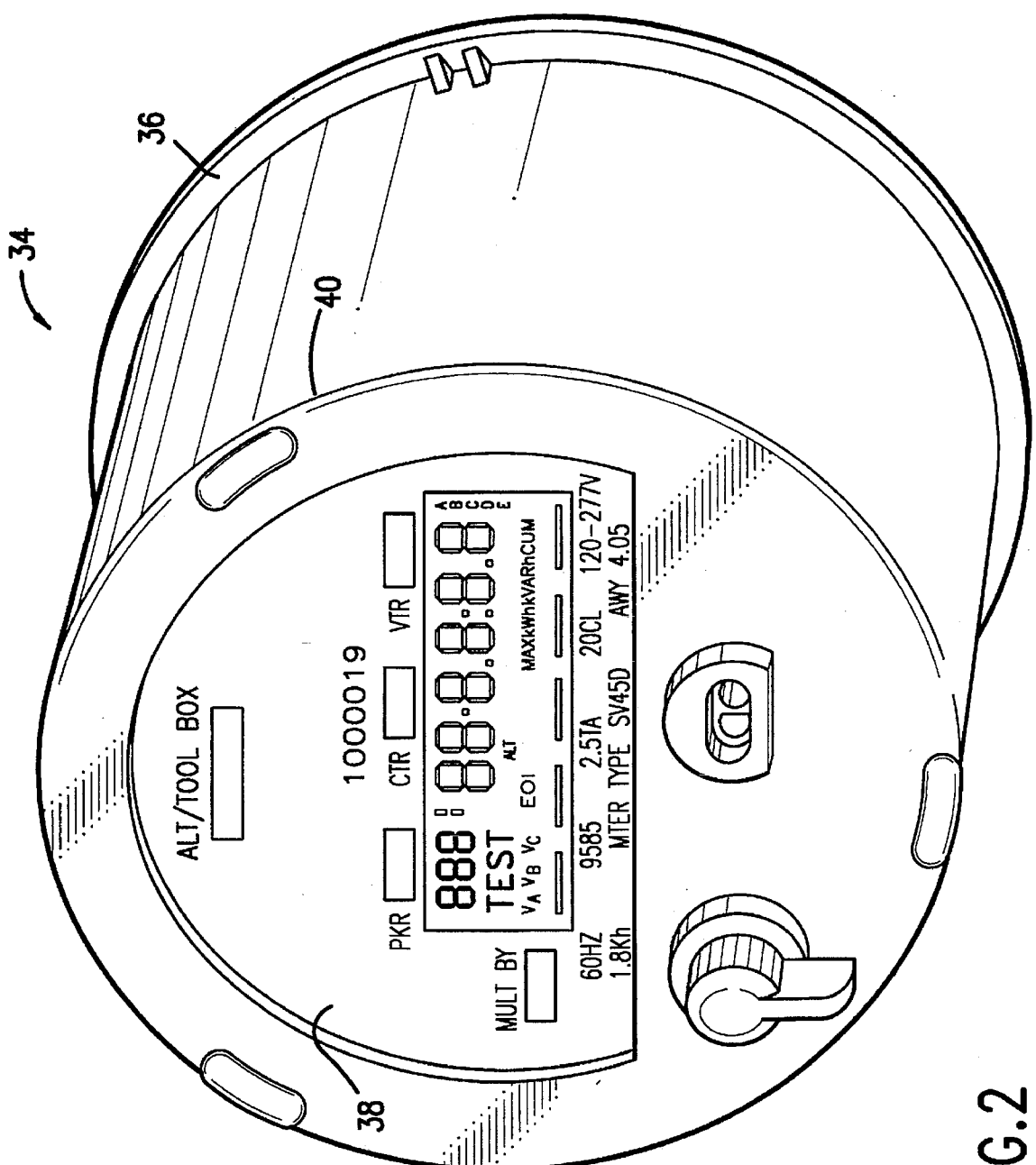
FIG. 2 is a perspective view of a meter into which the system of the present invention may be integrated.

Referring to FIG. 2, the system 20 is preferably incorporated into a solid state polyphase Kilowatt/Kilowatt-hours ("KW/Kwh") single function meter 34 (as illustrated in FIGS. 3, 17A–B and 18A–B and hereafter described in greater detail) including a generally circular base 36, conventional molded plastic housing (not shown) to which faceplate 38 is affixed, a meter cover 40. The meter 34 also includes conventional current sensing elements adapted for connection to existing electrical systems.

Figure 3:
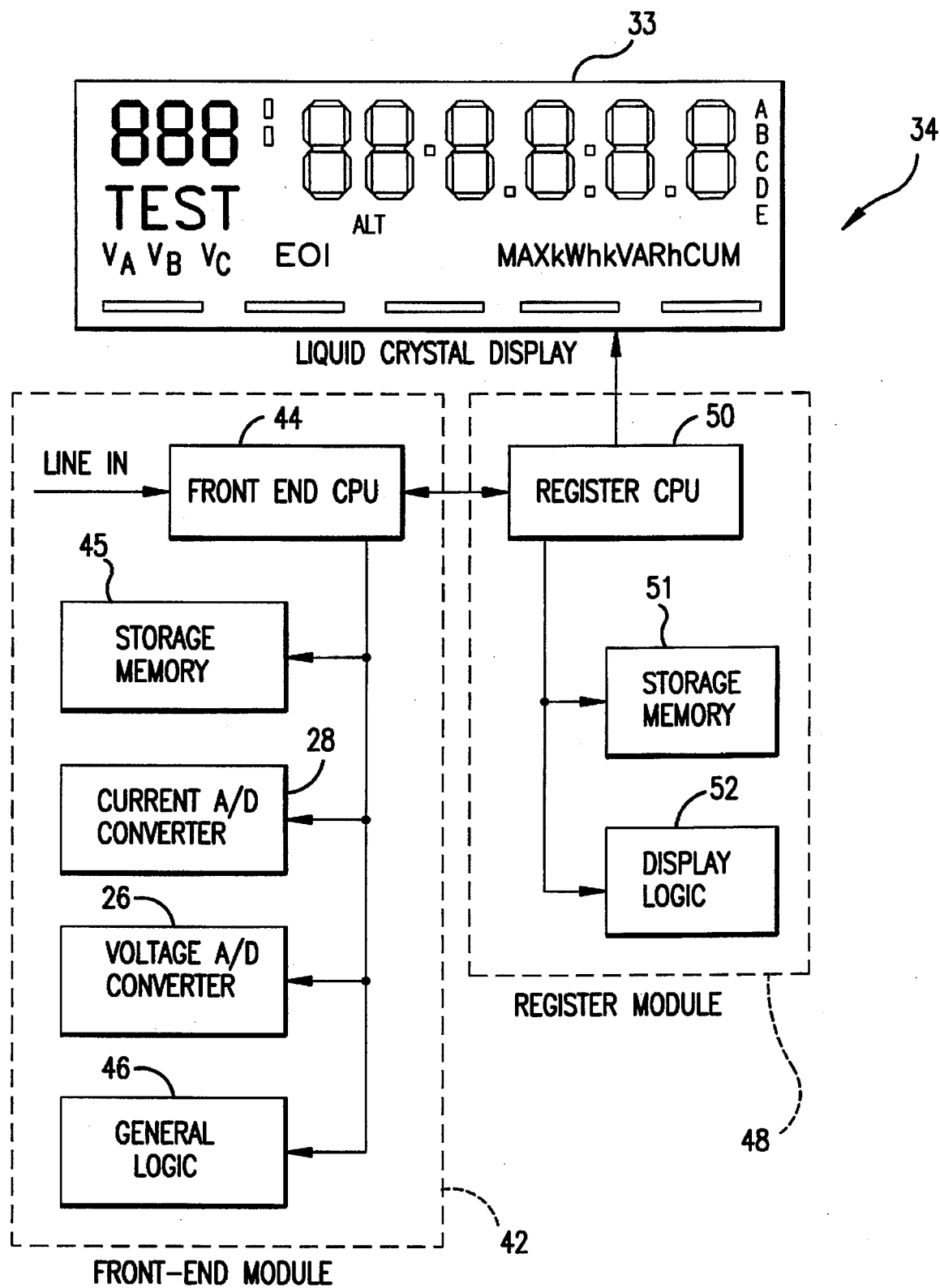
FIG. 3 is a block diagram of the meter of FIG. 2.

Referring now to FIG. 3 in the preferred embodiment, the diagnostics logic 30 for the system 20 of the present invention is incorporated into the front-end module 42 of the meter including a microprocessor 44, an 8 bit A/D converter which serves as the voltage A/D converter 26, random access memory 45, which serves in part as part of the system storage memory 24, and read-only memory and EEPROM, where the system diagnostics logic is located, at 46. The front-end module also preferably supports other meter functions, including meter component self-checks, A/D sampling, energy calculations, present demand, instantaneous values, any optional outputs, and meter communications in addition to the system and installation diagnostics and Toolbox display performed by the system 20 of the present invention. The display in this embodiment is a liquid crystal display 33 preferably including nine seven-segment digits, three decimal points and a plurality of icons useful in displaying electrical system information normally displayed by conventional meters as well as the diagnostic data generated by the system of the present invention, substantially as shown in FIG. 3.

The meter 34 also includes a register module 48 having a microprocessor 50 including: read only memory; random access memory 51, which also serves in part as system storage memory; a 96 segment LCD display driver; and 24 I/O lines. In this embodiment, the read only memory and register CPU 50 include the display logic for generating the Toolbox display as well as the error codes generated by the system 20 of the present invention. The register module 48 also supports other meter functions such as maintaining the billing values and billing register related functions, as well as time related functions including self-read, time of use, time of operation, and mass memory.

It should be noted, that in the embodiment of the meter 34 shown in FIG. 3, the system 20 of the present invention utilizes an 8 byte A/D converter 26 for sensing voltage signals, and an external 12 byte A/D converter 28 for sensing current samples. As will be appreciated by those skilled in the art, the current converter 28 requires higher resolution since current varies over a wider range than voltage. It will also be appreciated by those skilled in the art that it is preferable to have separate converters for simultaneously sensing the current and voltage so that the phase error caused by the current transformer may be directly compensated by adjusting the delay between the current sample and the voltage sample. Thus, in the event the current transformer is ideal and imparts no phase delay, then voltage and current can be sampled simultaneously with the independent converters 26 and 28.

The display logic for generating the Toolbox display and diagnostic error message of the system 20 is part of the display logic 52 which is implemented by the register CPU 50 in the particular embodiment of FIG. 3. It will be appreciated by those skilled in the art, however, that the logic and CPU capabilities of the system of the present invention may be implemented in a simpler single processor architecture (such as shown in FIG. 1), as well as the architecture shown in FIG. 3, or other hardware implementations without departing from the spirit of the present invention.

The system 20 of the present invention provides a full range of system diagnostic capabilities and diagnostic display functions through the "Toolbox" display. The system and installation diagnostics are defined in part by the user via the programming software. The Toolbox is a display of a fixed set of diagnostic information contained in a special mode of operation that can be accessed by a user, typically field personnel, preferably by activating a magnetic switch on the meter. Each of the diagnostic capabilities will be discussed in further detail below.

In one embodiment, the system 20 also provides an automatic service sensing capability. As described in further detail below, this capability includes logic for automatically determining the electrical service supported by the meter at installation, on subsequent power-ups, and periodically during the operation of the meter, based upon the pre-programmed form number of the meter and the angular displacement of voltage vectors Va and Vc, which are automatically periodically determined by the system as described below.

System and Installation Diagnostics

The system 20 of the present invention performs a plurality of system and installation diagnostics which may indicate potential problems with the electrical service, the incorrect installation of the meter, or internal meter malfunctions. Although these diagnostics may vary depending upon the type of electrical service supported by the meter, the below-described diagnostics are typically performed by the system.

Figure 4:
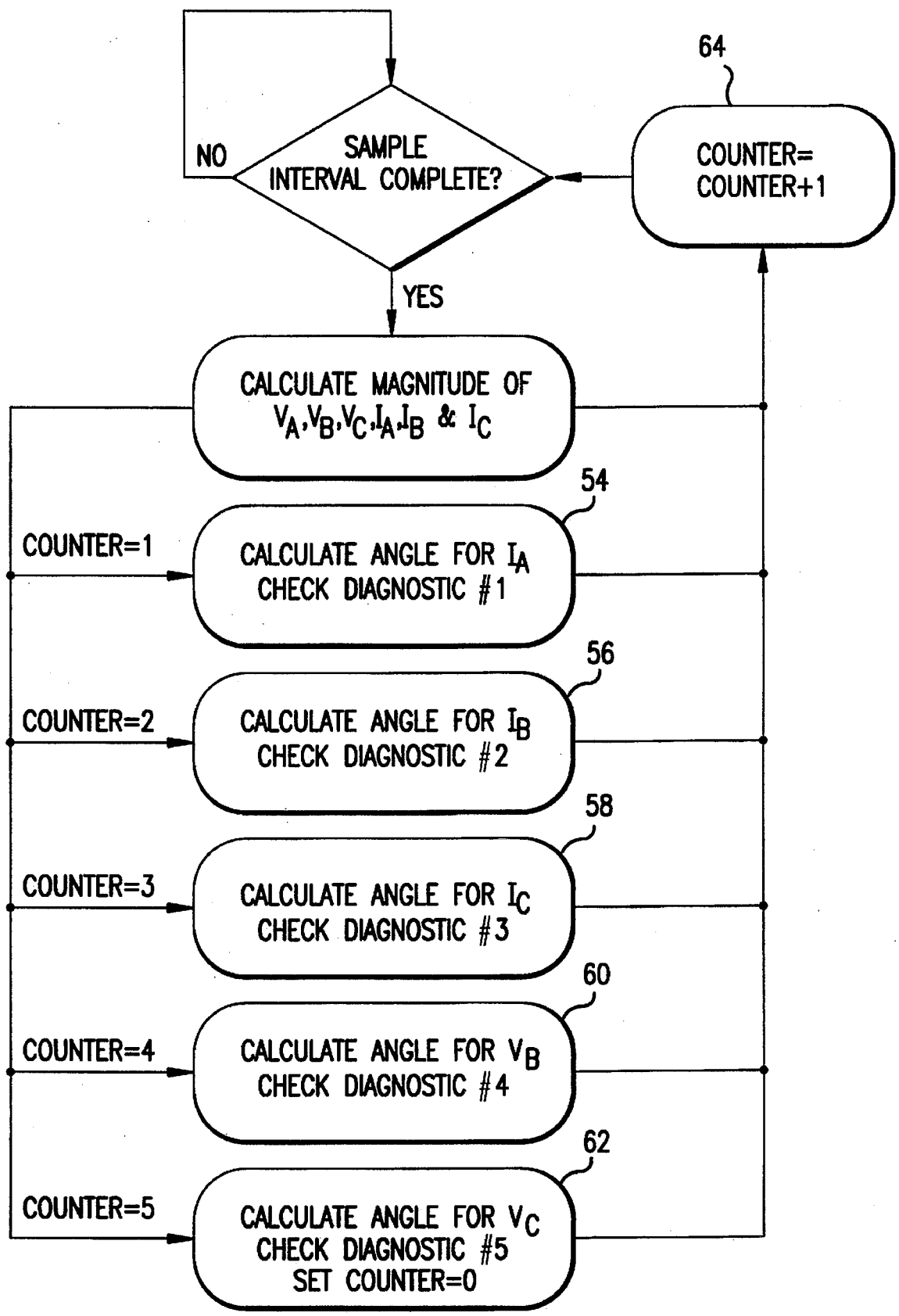
FIG. 4 is a flowchart of the electrical system diagnostics checks of the present invention.

Referring to FIG. 4, the system and installation diagnostics are also preferably implemented as a state machine. In the preferred embodiment, the diagnostics consist of four diagnostics that the user may choose for the meter to perform—(1) Polarity, Cross Phase and Energy Flow Check; (2) Phase Voltage Deviation Check; (3) Current Transformer Check; (4) Per-Phase Power Factor Check; and (5) Current Waveform Distortion Check. All selected diagnostics are performed by the meter at least once every 5 sample intervals.

When any error condition occurs according to the parameters defined by the user corresponding to the failure of a diagnostic, the meter displays information to indicate the error condition, and optionally triggers an output contact closure, such as a mercury wetted relay or a solid state contact programmed as an "Error Condition Alert." When an optional output is programmed as an Error Condition Alert, this output contact will close whenever any diagnostic error that has been selected by the user is triggered.

Referring again to FIG. 4, the system 20 of the present invention preferably iterates through a series of calculations and diagnostic checks, shown at 54–62. In the preferred embodiment, processing time is divided into sample intervals equal to 60 periods of the power line clock. For example, in a 50 Hz installation, this is 1.2 seconds. In a 60 Hz installation, the sampling interval would be 1 second.

Using a simple counter, the system 20 performs the necessary sampling and calculations to determine the angle of $I_A$ (preferably relative to the base phasor $V_A$), as well as performing Diagnostic Check #1 during the first interval, as shown at 54.

In the second interval, at 56, the system 20 accumulates the necessary samples to calculate the angle for $I_B$ and performs Diagnostic Check #2.

In the third interval, at 58, the system accumulates the necessary samples to calculate the phase angle for $I_C$ and performs Diagnostic Check #3.

In the fourth interval, at 60, the system accumulates the necessary samples to calculate the phase angle for $V_B$ and performs Diagnostic Check #4.

In the fifth sample interval, at 62, the system accumulates the necessary samples to calculate the phase angle for Vc, performs Diagnostic Check #5, and sets the counter to zero.

The counter is incremented (at 64) at the end of each of these intervals, and the sequence is repeated continuously. Thus, in a 60 Hz system, the phase angle for each of the current and voltage phasors is calculated, and each of the four diagnostic checks are performed, once every 5 seconds. As will be appreciated by those skilled in the art, different time intervals can be implemented and/or the sub-routines of 54–62 can be modified to accommodate more frequent or infrequent checks of one or more of the selected diagnostics as desired.

DIAGNOSTIC #1—Polarity, Cross Phase and Energy Flow Check

Figure 5:
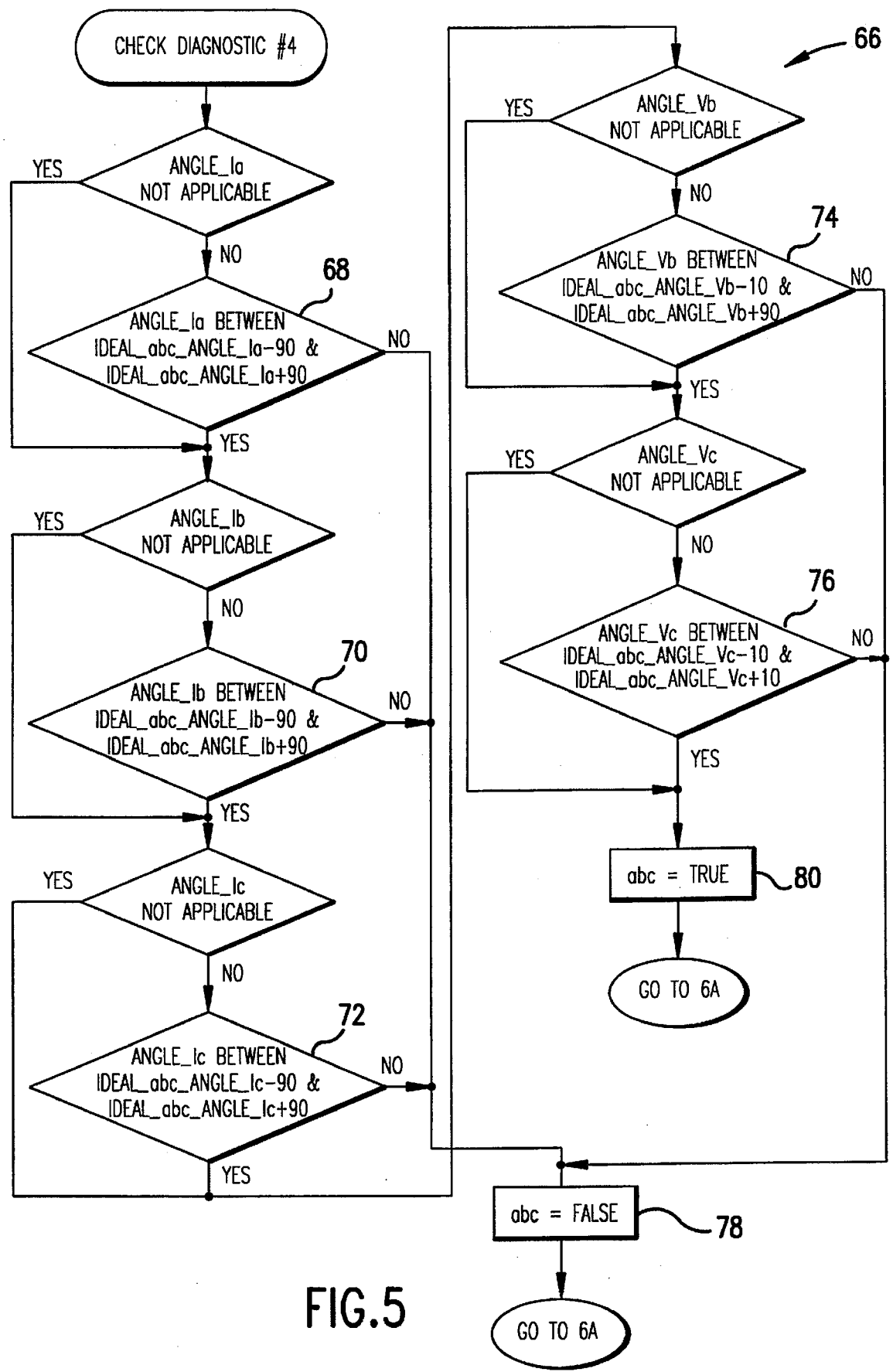
FIG. 5 is a flowchart of a first portion of the polarity, cross phase and energy flow diagnostic implemented by the present invention.
Figure 6:
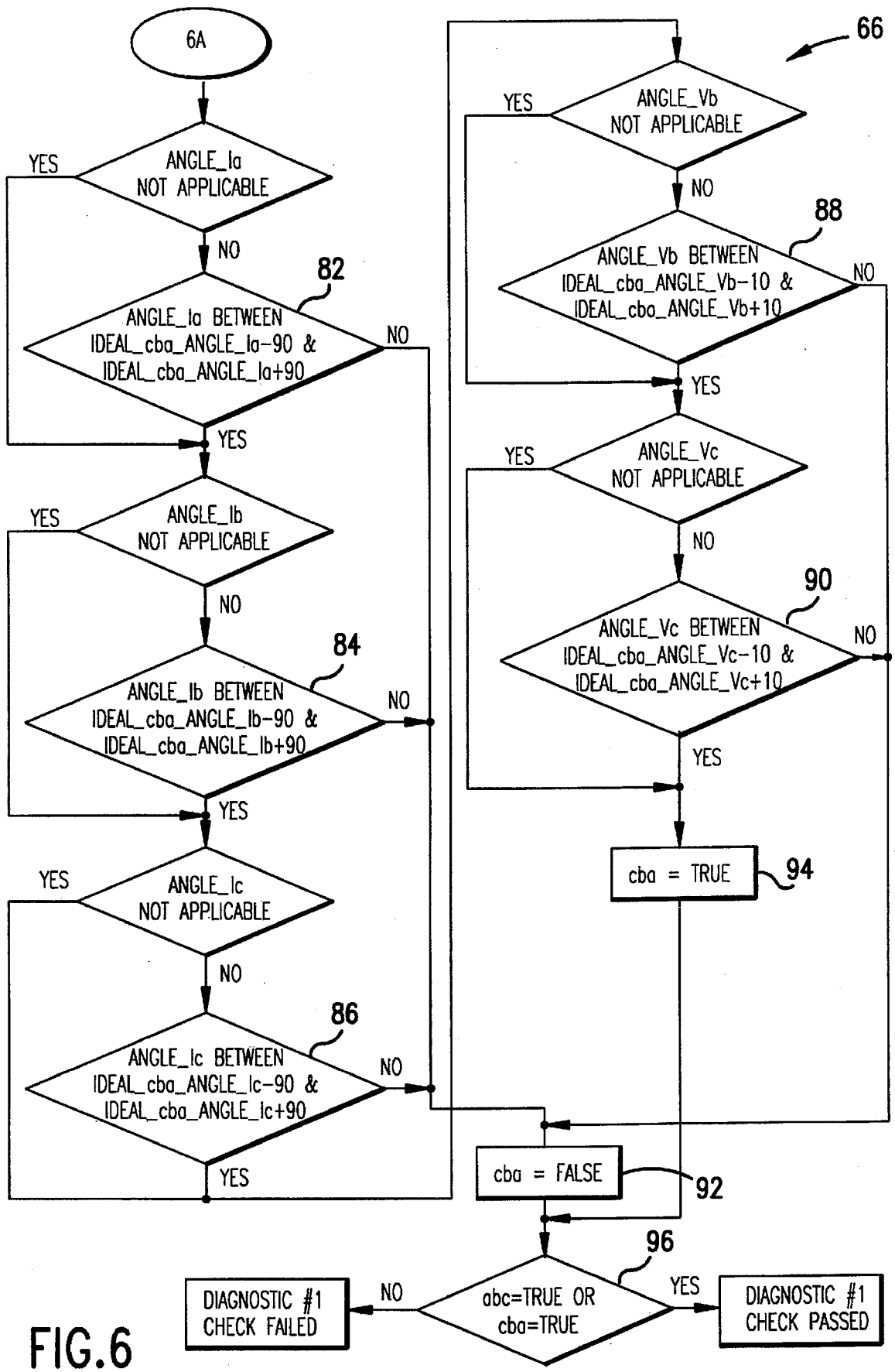
FIG. 6 is a flowchart of the second portion of the polarity, cross phase and energy flow diagnostic implemented by the present invention.

Referring to FIGS. 5 and 6, the Polarity, Cross Phase and Energy Flow Check is designed to check for reversed polarity of any phase voltage or current, and to check for voltage from one phase being incorrectly wired to the current from a different phase. This condition may also result from the presence of cogeneration. This check is accomplished by periodically measuring the angle for each voltage and current phasor with respect to a reference phasor (preferably $V_A$). Each angle is compared to its ideal angle, defined as the angle which would result from a balanced, purely resistive load. If any voltage angle is lagging or leading its ideal angle by more than a predefined amount, (preferably 10°), or if any current angle is lagging or leading its ideal angle by more than a second predetermined amount (preferably 90°), the meter indicates a Diagnostic #1 error.

As shown in FIG. 5, the Polarity, Cross Phase and Energy Flow Check diagnostic routine 66 of the system 20 first checks each angle (where applicable for the particular electrical system to which the meter is connected) of each of the current and voltage phasors (at 68–76) to determine whether each is within tolerance of the predetermined ideal for an ABC rotation. If any of the angles are not within tolerance of the ideal, the system sets the abc flag false (at 78) and proceeds (as shown in FIG. 6) to check each of the angles, assuming a CBA rotation.

If all of the angles are determined at 68–76 to be within tolerance of their predetermined ideal, the system 20 sets the abc flag true, at 80, and proceeds to check the angles assuming a CBA rotation.

Referring now to FIG. 6, once the ABC rotation check is performed, the system proceeds at 82–90 to check the angles for each of the current and voltage phasors to determine whether, for a CBA rotation, the phase angles are within tolerance of the predetermined ideal angles. If any one of the phase angles is outside of the range of tolerance for the predetermined ideal angle for that phasor, the system sets the cba flag false, at 92. If all of the phase angles are determined to be within tolerance of the predetermined ideal angles, the system sets the cba flag true, at 94. The system 20 then determines whether either the abc or the cba flag is true. If either is true, this diagnostic check is passed. If neither the abc flag nor the cba flag is true, the diagnostic check has failed for both ABC and CBA rotations, indicating a diagnostic error.

When a diagnostic error is determined, the system records the occurrence of the error and displays the error as further described hereinafter. In the preferred embodiment, however, the initial display of this diagnostic error will not occur until the error condition has been present for three consecutive checks.

As will be appreciated by those skilled in the art, this diagnostic may indicate one of several problems, including cross phasing of a potential or current circuit, incorrect polarity of a potential or current circuit, reverse energy flow of one or more phases, or internal meter measurement malfunction.

DIAGNOSTIC #2—Phase Voltage Deviation Check

Figure 7:
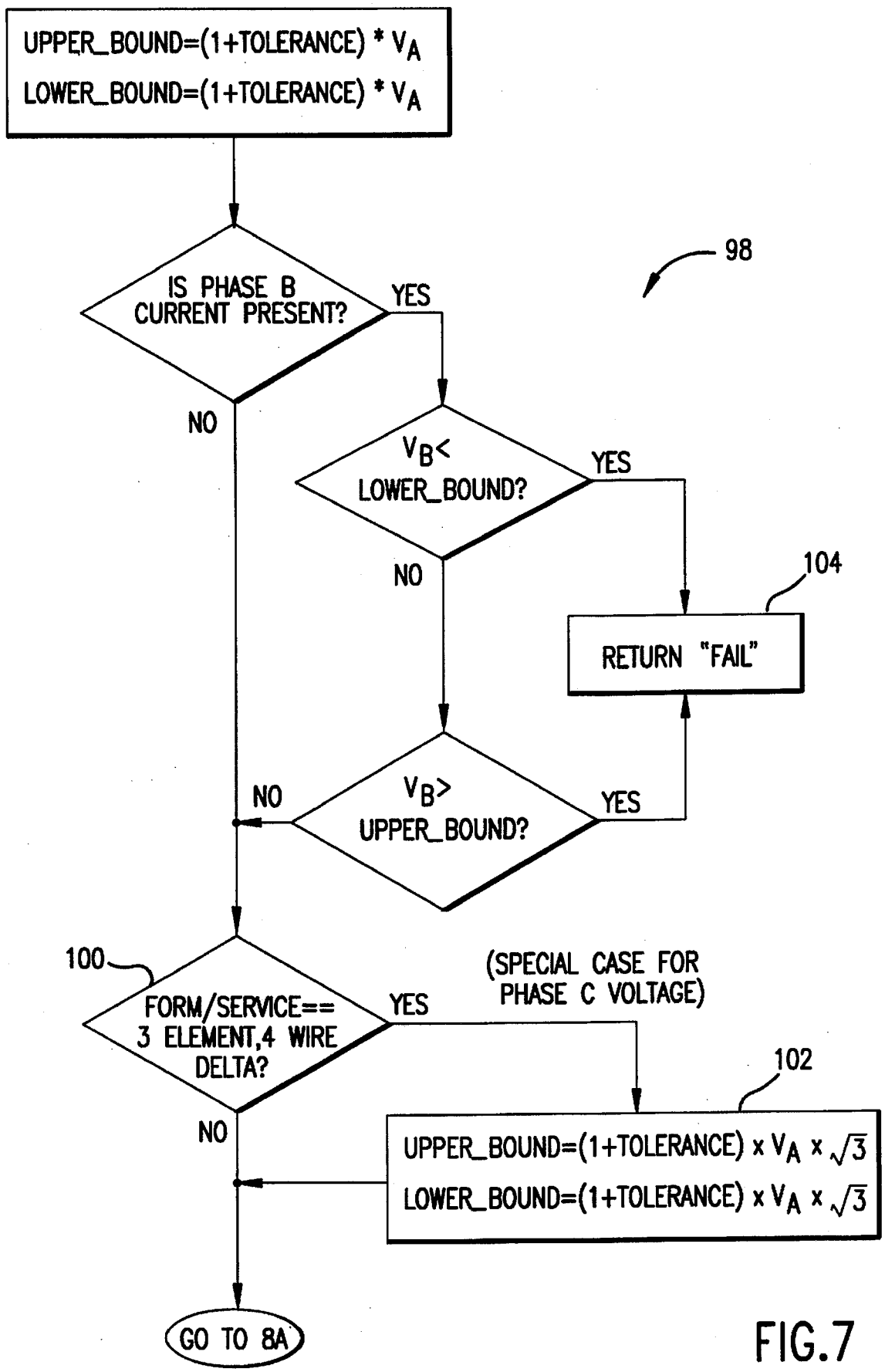
FIG. 7 is a flowchart of a first portion of the phase voltage deviation diagnostic routine implemented by the present invention.
Figure 8:
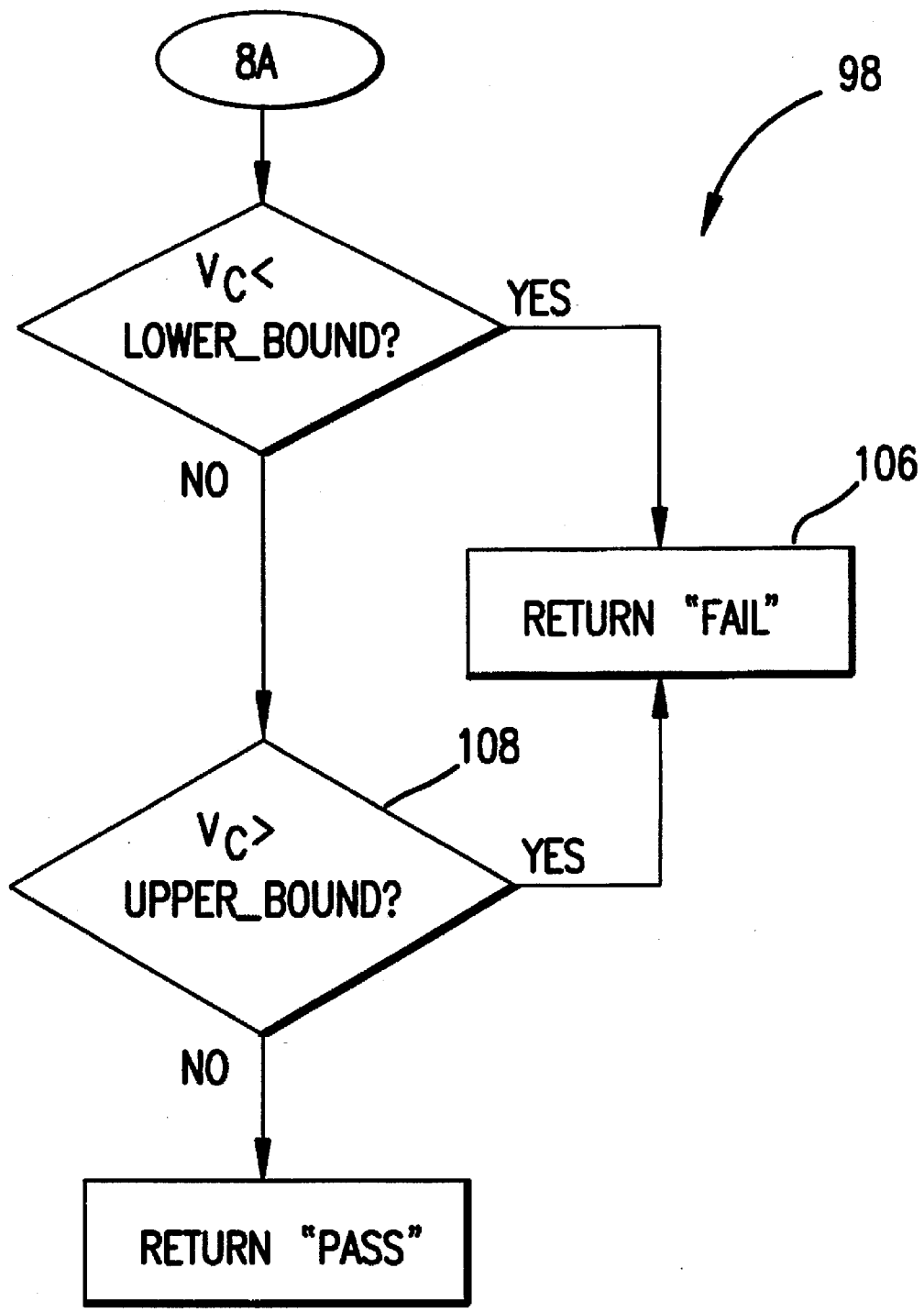
FIG. 8 is a flowchart of a second portion of the phase voltage deviation diagnostic implemented by the present invention.

Referring now to FIGS. 7 and 8, the Phase Voltage Deviation Check is designed to check, at 98, for any phase voltage being outside an envelope defined by the user. This is actually a check of the distribution transformer voltage gap. This check is accomplished by periodically measuring the voltage for each phase and checking it against a predefined voltage envelope referenced by the program software.

The formula used for this check is:

$$V_{upper} = \left(1 + \frac{xx}{100}\right) V_A, \text{ and}$$

$$V_{lower} = \left(1 - \frac{xx}{100}\right) V_A$$

If any phase voltage is above $V_{upper}$ or below $V_{lower}$, the meter will indicate a Phase Voltage Envelope Diagnostic Error.

It should be noted that in the preferred embodiment, the system 20 checks, at 100, to determine whether the electrical service supported by the meter incorporating the system 20 is a three element, four wire delta service. If so, the system calculates special case upper and lower bounds for the phase C voltage, as shown at 102.

Again, if either of the phase B or phase C voltages exceeds the predetermined bounds, the system indicates the failure of this diagnostic check (at 104 or 106), indicating a diagnostic error, and the error is recorded and the appropriate error message is displayed as hereinafter described. Otherwise, this diagnostic check is passed (at 108) and this check is completed.

It should be noted, however, that in the preferred embodiment, the initial display of this diagnostic error will not occur until the error condition has been present for three consecutive checks.

This diagnostic may indicate a loss of phase potential, incorrect potential transformer ratio, shorted potential transformer windings, incorrect phase voltage, and internal meter measurement malfunction, as well as other potential problems.

DIAGNOSTIC #3—Inactive Phase Current Check

Figure 9:
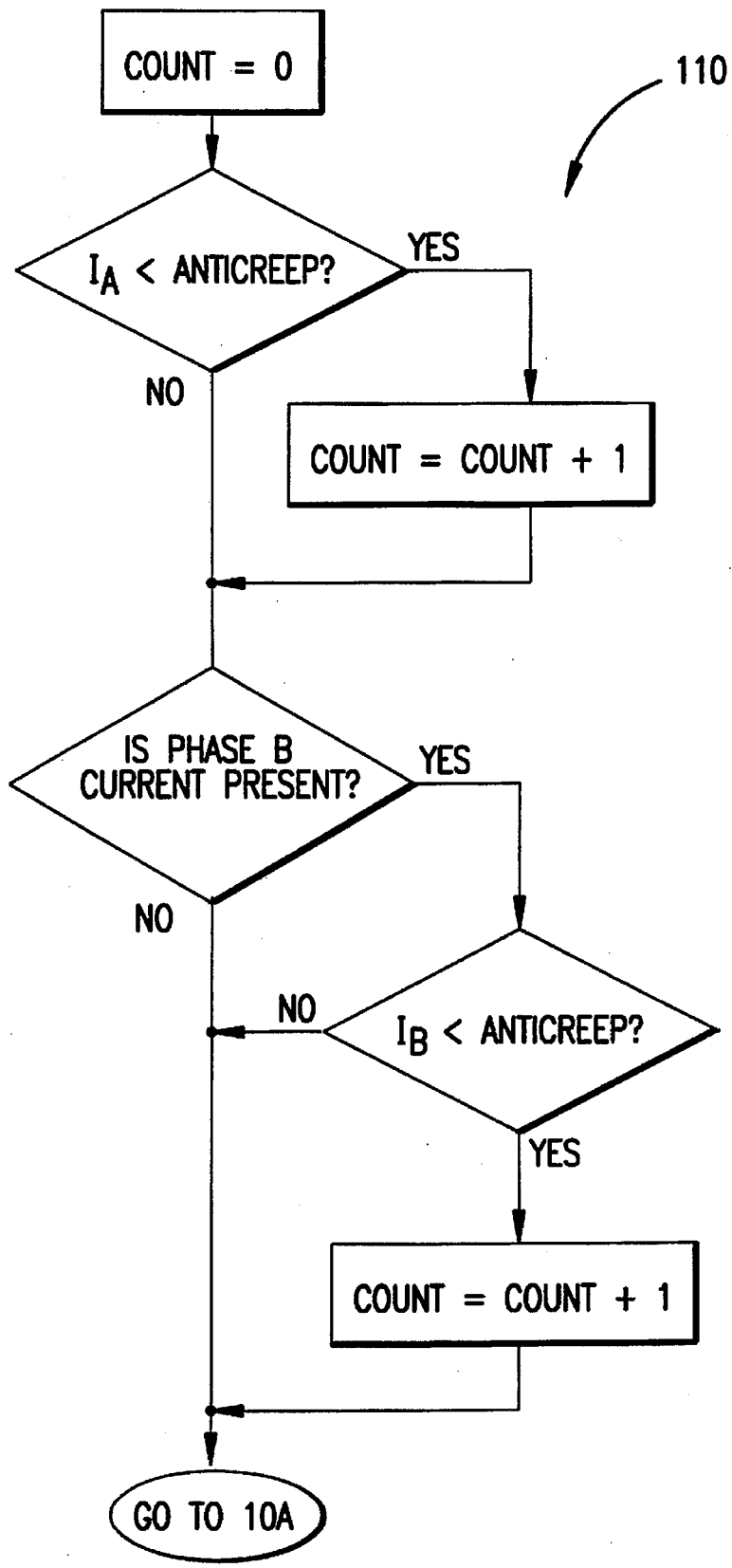
FIG. 9 is a flowchart of a first portion of the inactive phase current diagnostic implemented by the present invention.
Figure 10:
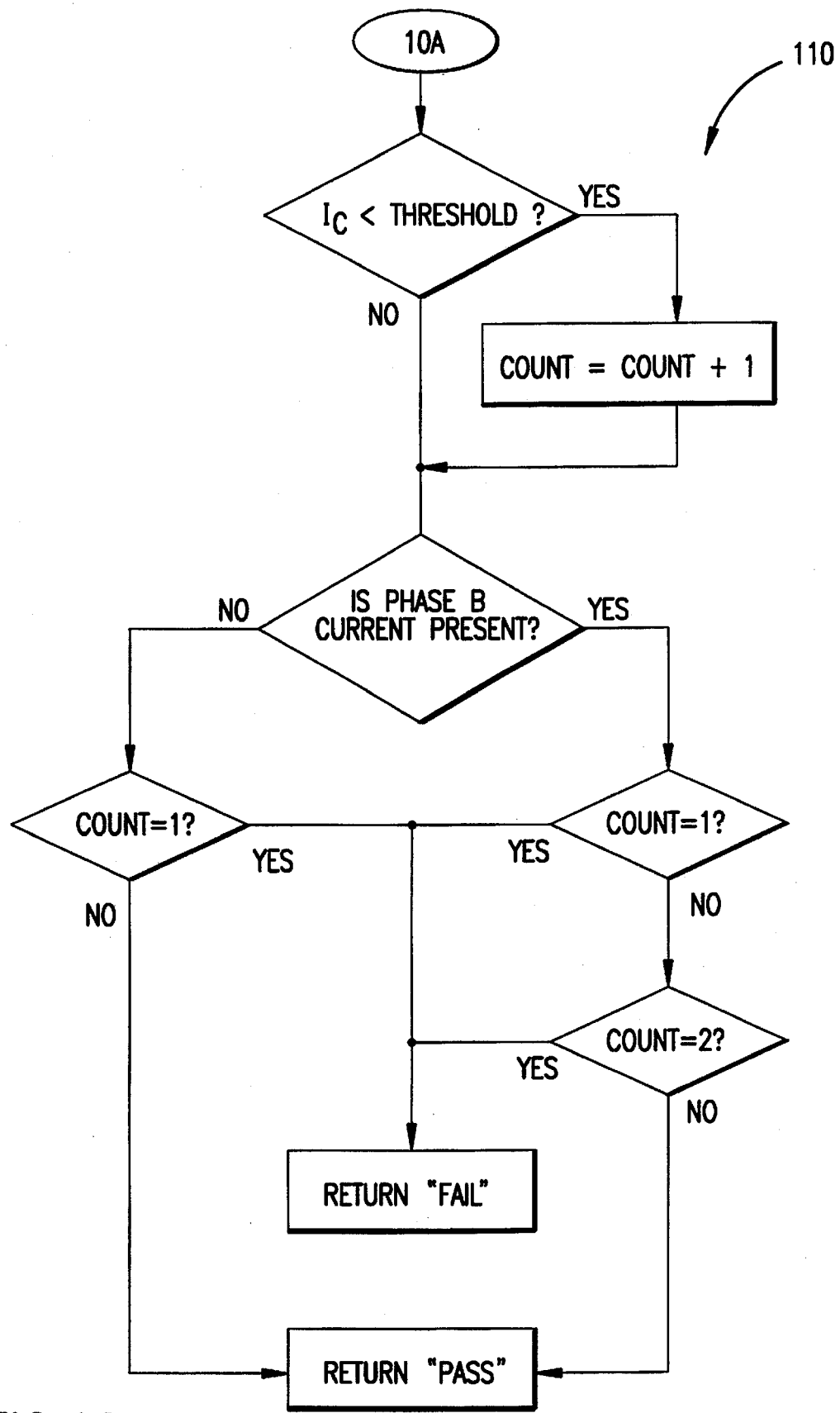
FIG. 10 is a flowchart of a second portion of the inactive phase current diagnostic implemented by the present invention.

Referring now to FIGS. 9 and 10, in performing the Inactive Phase Current diagnostic, the system 20 will periodically compare the instantaneous RMS current for each phase to a predefined minimum current level, which is preferably selectable from 5 ma to 200 A in increments of 1 ma. If all three phase currents are above the acceptable level, or all three phase currents are below the acceptable level, this diagnostic will pass. Any other combination will result in a Diagnostic #3 failure, and a Diagnostic #3 error will be indicated.

Again, however, the recording and display of this diagnostic error will preferably not occur until the error condition has been present for three consecutive checks.

The occurrence of a Diagnostic #3 error signifies the existence of a magnitude error with one or more of the meter phase currents. In order to determine the specific problem, the user must obtain the phase current information from Toolbox Mode, as described hereinafter.

It will be appreciated by those skilled in the art that this diagnostic check can be utilized to indicate any one of several potential problems, such as an open or shorted current transformer circuit.

DIAGNOSTIC #4—Per-Phase Power Factor Check

Figure 11:
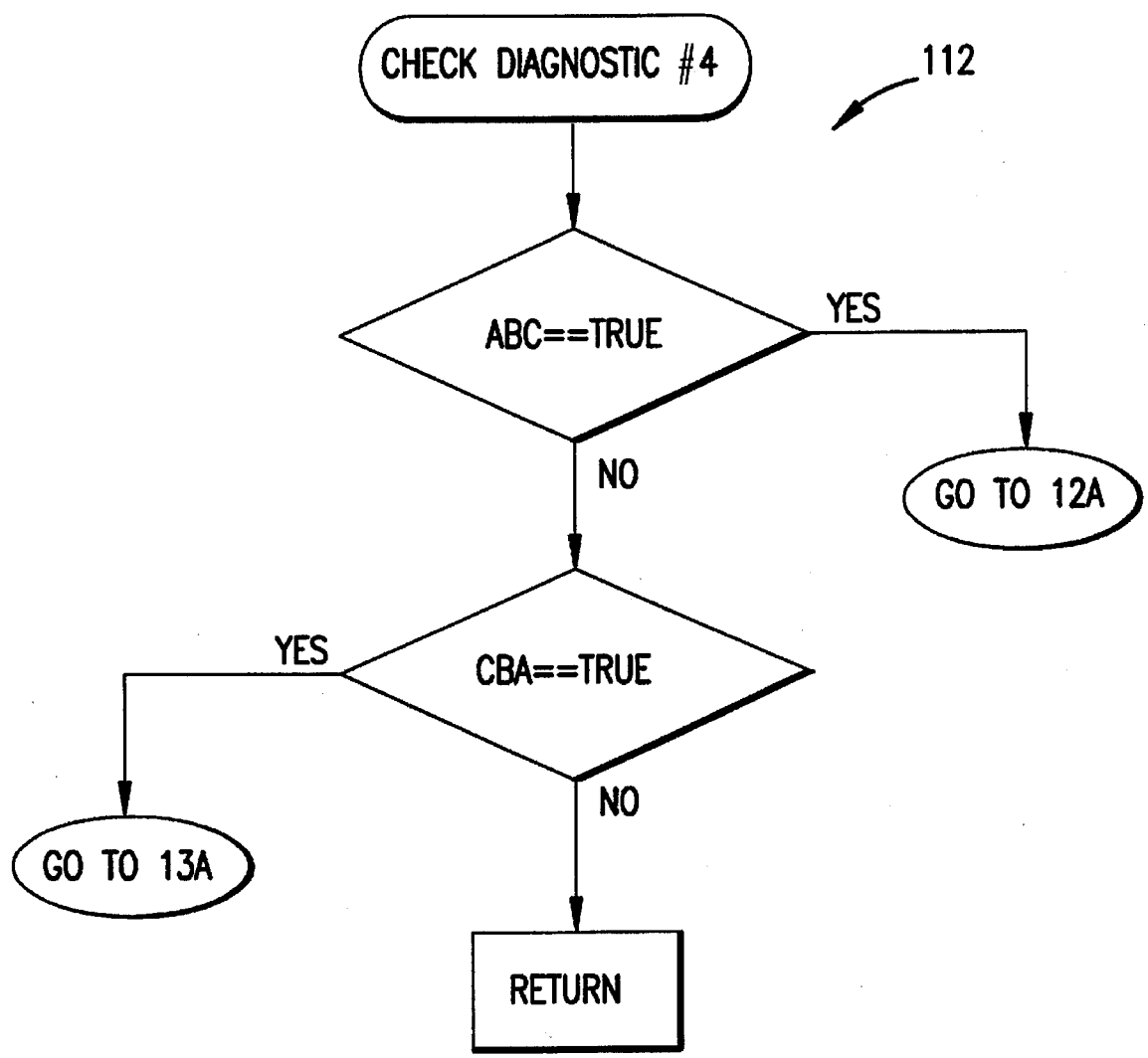
FIG. 11 is a flowchart of a first portion of the per-phase power factor diagnostic implemented by the present invention.
Figure 12:
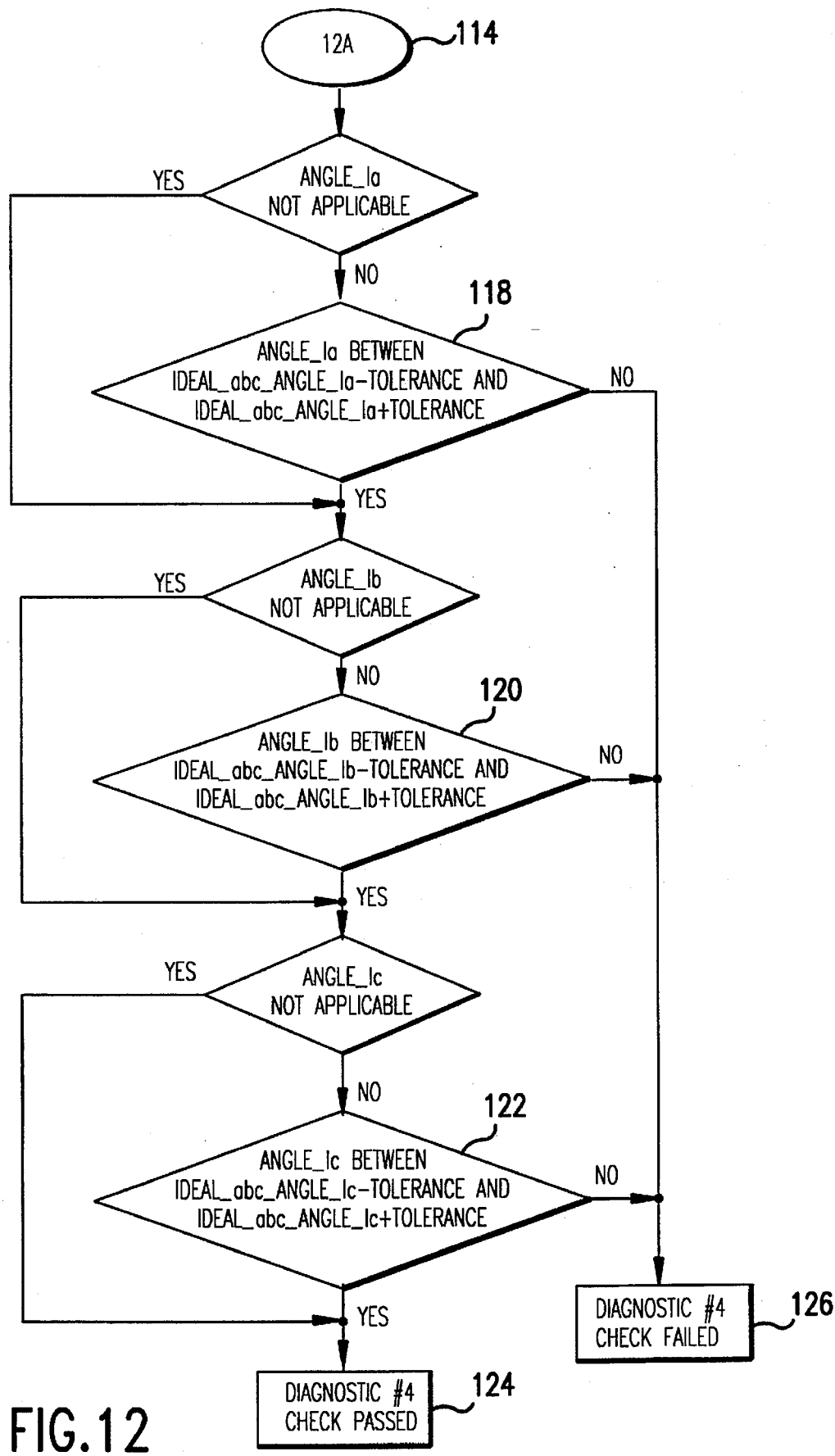
FIG. 12 is a flowchart of a second portion of the per-phase power factor diagnostic implemented by the present invention.
Figure 13:
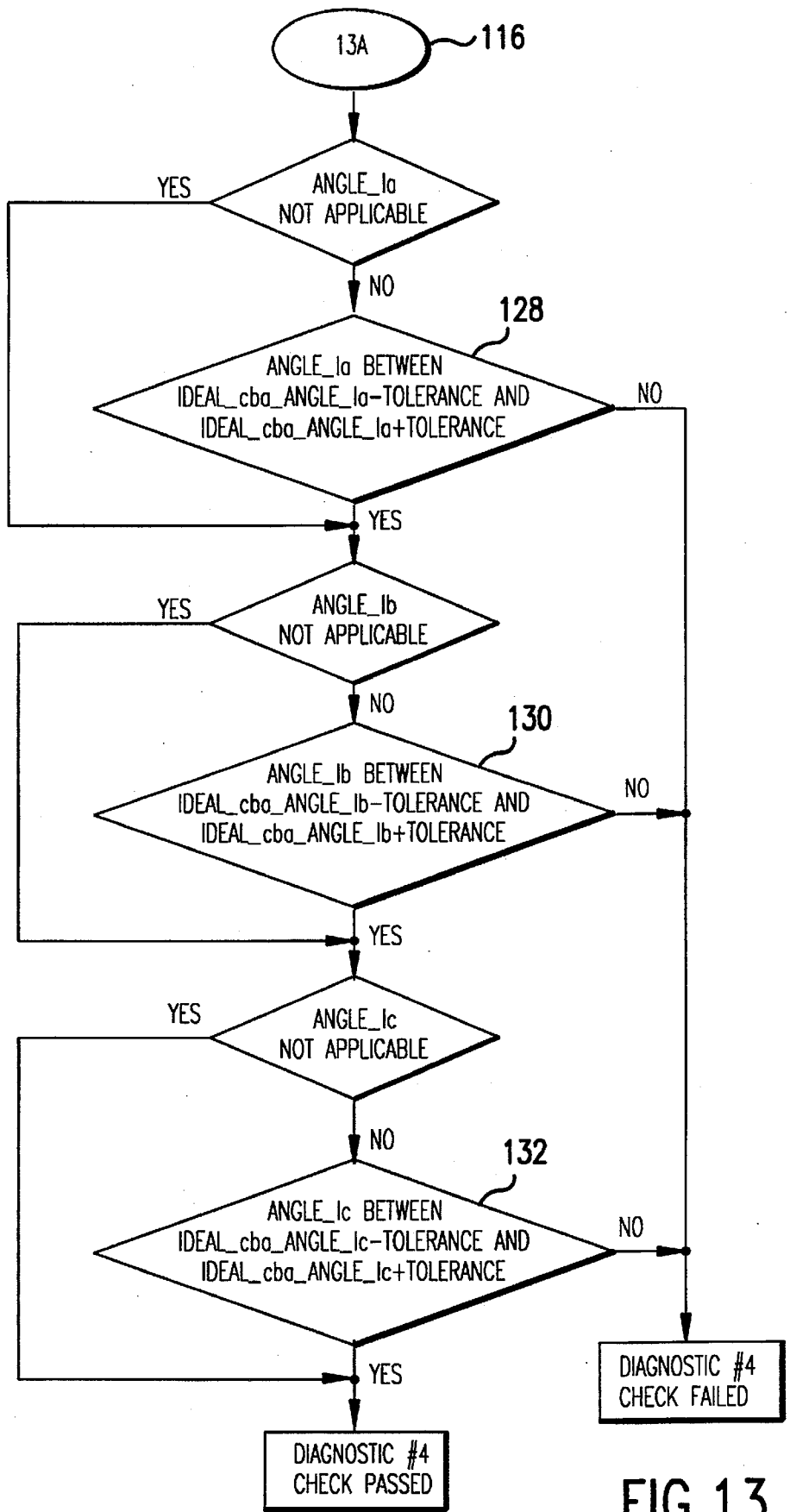
FIG. 13 is a flowchart of a third portion of the per-phase power factor diagnostic implemented by the present invention.

Referring to FIGS. 11–13, the Per-Phase Power Factor Diagnostic Check is designed to verify that, for each meter phase, the angle between the current phasor and the idealized voltage phasor is within an envelope specified by the user (±1–90'). Since this tolerance is more restrictive than for Diagnostic #1, the system 20 does not perform this diagnostic check until Diagnostic #1 has passed. This diagnostic may indicate any one of a series of potential problems, including poor load power factor conditions, poor system conditions, or malfunctioning system equipment.

The system 20 first checks the abc and cba rotation flags at 114 and 116. If both of these flags are false, this indicates that Diagnostic #1 has failed. Since the tolerances of this diagnostic are more restrictive than Diagnostic #1, the diagnostic check is aborted.

If either the abc or cba flags are true (indicating that Diagnostic #1 has passed), the system 20 performs the appropriate ABC or CBA rotation checks at 114 and 116, respectively. For an ABC rotation, the system checks the angle between the appropriate current phasor and the idealized voltage phasor, at 118–122, to determine whether the angle is within an envelope specified by the user. If the angle is between the predetermined envelope, the diagnostic is passed at 124. If not, the diagnostic is failed (at 126), indicating a Diagnostic #4 error. In the event of a CBA rotation, the system 20 performs similar envelope checks at 128–132 for the applicable current phasor.

DIAGNOSTIC #5—Current Waveform Distortion Check

Figure 19:
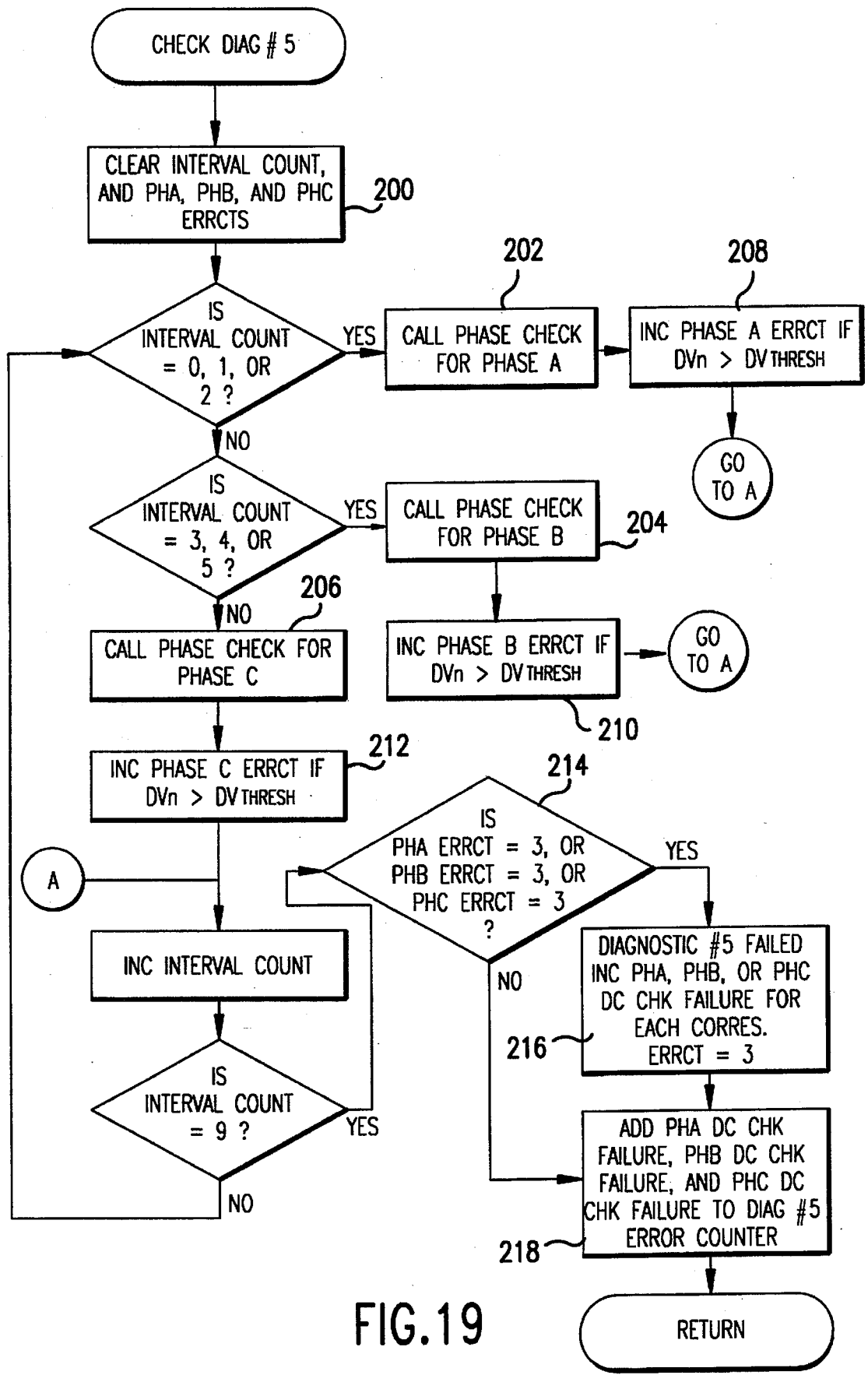
FIG. 19 is a first flowchart of the current waveform distortion detection diagnostic implemented by the present invention.
Figure 19:
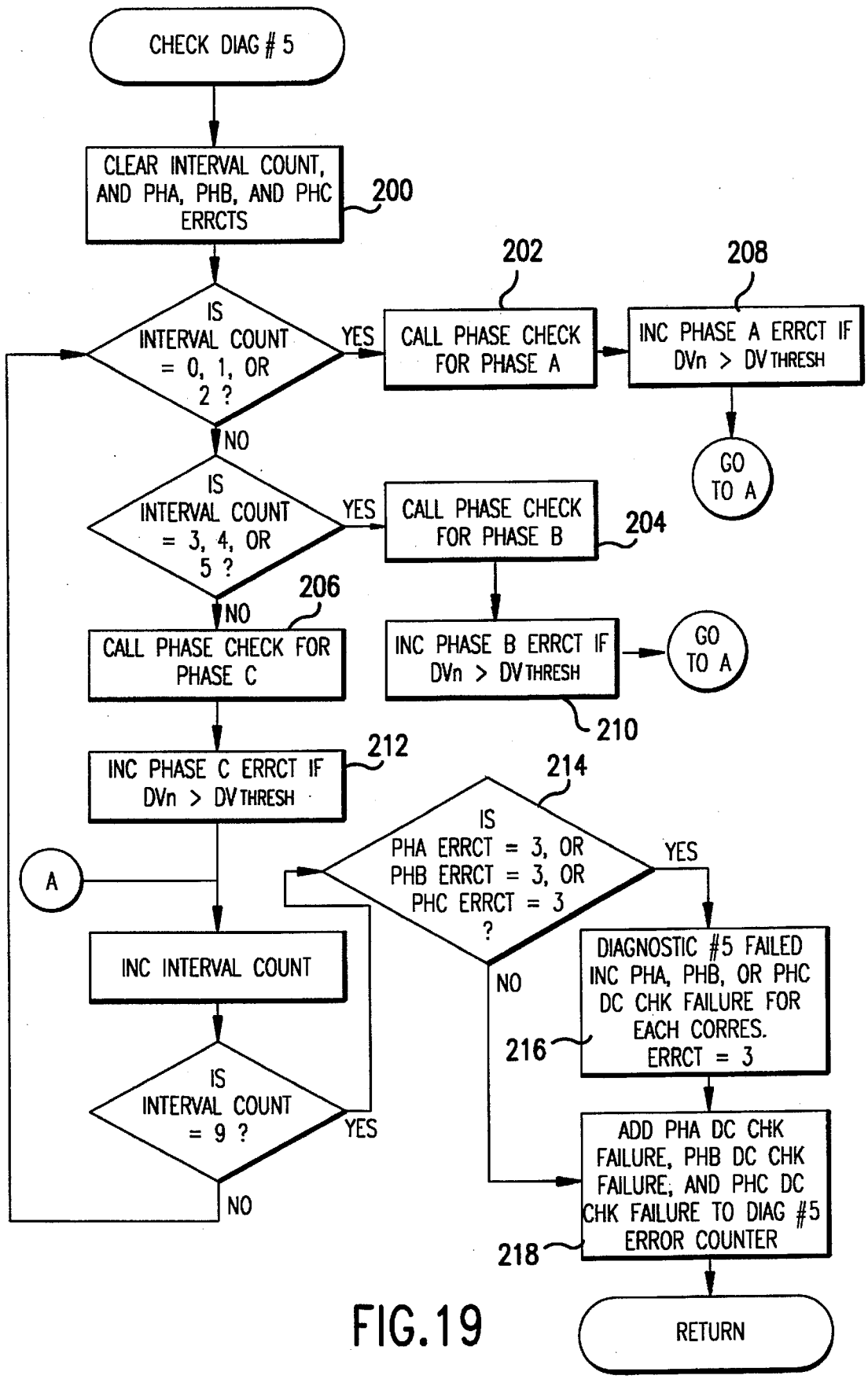

Referring to FIG. 19, the Current Waveform Distortion Check is designed to detect the presence of DC current on any of the phases. This diagnostic is particularly useful on meters which are designed to pass only alternating current, and where performance of the current transformer degrades with enough direct current, since the direct current biases the transformer so that it operates in a non-linear region.

The principal way of generating direct current on a meter is by placing a half-wave rectified load in parallel with a normal load. The presence of the half-wave rectified current signal has the effect of heightening either the positive or negative half cycle of the waveform while leaving the other one unaffected. For those meters which are not designed to pass direct current, when this signal appears at the input of the current transformer it is level shifted so that the output has an average value of zero. However, the peak of the positive and negative half cycles of the wave no longer have the same magnitude. The direct current detection diagnostic exploits this phenomenon by taking the differences of the positive and negative peak values over a sampling interval of the meter. The result of the accumulation of the current samples over an interval should be a value near zero if no direct current is present. If direct current is present, then the accumulated value will be significantly higher. This method, referred to hereinafter as the Comb Filter Method, yields accurate values regardless of the phase and magnitude of the accompanying alternating current waveform.

Since the meters employing the present invention are typically poly-phase meters, meaning that there are two or three phase currents measured by the meter, it is possible for someone to tamper with the meter by adding a half-wave rectification circuit across the load to introduce direct current into the installation. This circuit could be added on a single phase. For this reason, the DC detection diagnostic should be enabled to detect direct current on a per-phase basis.

The Comb Filter Method of calculating a direct current detection value per phase is illustrated in the flowchart of FIG. 19. The method involves the following steps during each sample interval:

(1) The sign of the first voltage sample in each interval is recorded;

(2) Using the sign of the first voltage sample, the first voltage zero crossing is detected;

(3) Accumulate the second sample of current after the voltage zero cross over into the current peak accumulator (this is approximately 90°);

(4) Accumulate every fourth current sample after the initial current sample into the current peak accumulator (approximately 180° apart);

(5) Repeat step 4; and (6) At the end of the sample interval, divide the accumulated current peak values by the appropriate current being used during the interval. This has the effect of normalizing the result for three different gain ranges that exist for the current. Also, zero the accumulator for the next sample interval.

The result of the division in step 6 is a unitless value which is directly proportional to the amount of direct current present on that phase. This value will be referred to as the DC Detection Value. The DC Detection Value is compared to a preselected Detection Threshold Value to determine whether direct current may be present. In the preferred embodiment, the Detection Threshold Value is set to 3.000, since it has been found that a value of 3.000 is a suitable threshold for both 200 amp and 20 amp meters.

This diagnostic utilizes A/D sampling to ascertain the voltage and current from each phase, sampled 481 times for each sample interval (typically 1 second). The current for each phase has a gain associated with it. This gain can change every sample interval if the magnitude of the current is changing fast enough. This fact is important in detecting direct current, since the detection technique will require the summing of sampled current values over some length of time. If a time period greater than the sample interval is chosen, then the possibility exists that the sum of current values includes samples taken at different gain ranges, and thus the accumulated samples lose their meaning. Thus, it is important that the resulting accumulated current peak values be normalized by the appropriate current gain used during each interval as specified in step (6) above.

It should be noted that the calculation of a DC Detection Value will only occur for one phase during any single sample interval. Thus, unlike the other diagnostics which are preferably performed by the meter at least once every 5 sample intervals (typically every 5 seconds), each of the possible three phases is checked three consecutive times, at 5 second intervals, for a total sampling time of 15 seconds per phase. Thus, the total length of time required for a complete Current Waveform Distortion Check is 45 seconds (15 seconds for each of phase A, phase B, and phase C).

If the DC Detection Value is found to be greater than the selected Detection Threshold Value for all three consecutive intervals for a particular phase, then direct current will be recorded as present on that phase. After all three phases have been checked, if direct current was recorded on any phase, then the diagnostic is turned on. When a 45 second internal has passed in which no failure was found on any phase, then the diagnostic will be turned off.

It will be appreciated that the Detection Threshold Value should be set at a level which corresponds to the level of direct current for which the current transformer on the meter begins to degrade, so that a Diagnostic #5 failure can be detected and recorded before this level of direct current is reached.

Figure 20:
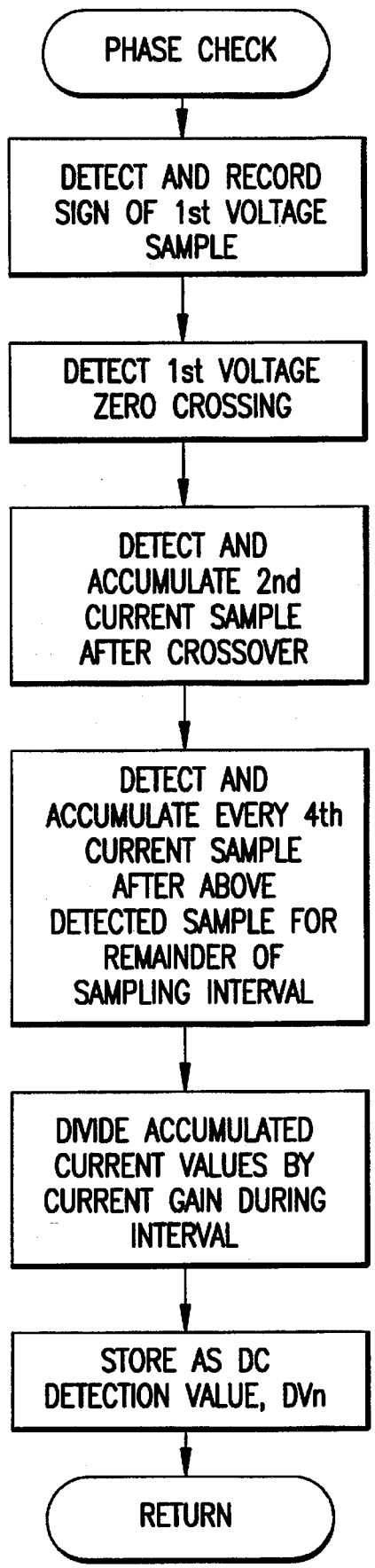
FIG. 20 is a second flowchart of the current waveform distortion detection diagnostic implemented by the present invention.

Referring to FIG. 20, the diagnostic calls the Phase Check routine three times for each of the three phases. The Phase Check routine then accumulates current samples, normalizes the accumulated samples and stores the value as a DC Detection Value $DV_n$, for each of three sample intervals for that phase.

Referring again to FIG. 19, the Check DIAG #5 Routine begins at 200 by clearing the interval count and each of the phase A, phase B and phase C error counts (PHA ERRCT, PHB ERRCT, and PHC ERRCT). The interval counter may be a modulo 9 counter which may be incremented from the value 0–8, then back to 0, etc. For each of the first three 5 second intervals (i.e., interval count=0, 1 or 2), the routine performs a Phase Check, at 202, for phase A. For the next three 5 second intervals (i.e., interval count=3, 4, or 5), the routine performs a Phase Check, at 204, for phase B. And, for the final three 5 second intervals (i.e., interval count=6, 7, or 8), of the 45 second diagnostic cycle, the routine performs a Phase Check, at 206, for phase C.

Upon completion of each Phase Check routine for phase A, the system determines, at 208, whether the DC Detection Value is greater than the Detection Threshold Value, and increments the phase A error counter (Phase A ERRCT) if the DC Detection Value is greater than the threshold. The Phase Check routine is then called three times for phase B. Again, after each Phase Check routine is completed, the system, at 210, determines whether the DC Detection Value is greater than the Detection Threshold Value and sets the phase B error counter (Phase B ERRCT) accordingly. The Phase Check routine is then called for phase C. Again, the system, at 212, compares the developed DC Detection Value for phase C to the Detection Threshold Value and increments the error counter (phase C ERRCT) for phase C accordingly.

The system then determines, at 214, whether any of the phase A, phase B, or phase C error counters is equal to 3. If so, a DC current has been detected on that phase for three consecutive sampling intervals, the system, at 216, notes a Diagnostic #5 failure, phase A, phase B or phase C failure counter (PHA CHK FAILURE, PHB CHK FAILURE, or PHC CHK FAILURE, respectively), for each phase for which ERRCT=3. In any event, each of the PHA, PHB, and PHC CHK FAILURE counters are added to the Diagnostic #5 counter, at 218, (indicating the total accumulated number of DAIG #5 failures) and the diagnostic is completed.

Thus, at the end of a 45 second sample interval, after each phase has been checked three times, a Diagnostic #5 failure will be recorded if any one of the three phase error counters has registered failures on all three checks. The Diagnostic #5 counter (DIAG #5 ERROR COUNTER) reported in the Tool Box mode will be a sum of the three per-phase DC detection counters.

Automatic Service Sensing

In one embodiment of the invention, the system includes logic for automatically determining the electrical service supported by the meter based upon the pre-programmed form factor of the meter and the angular displacement of voltage vectors $V_a$ and $V_c$. This capability eliminates the need for the customer to program the electrical service type into the meter in advance of installation and, thereby, allows the customer to take full advantage of the flexible, multi-service capability of the meter and reduce the customer's meter inventory requirements. In addition, the automatic electrical service sensing capability ensures that the meter and any of the enabled system and installation diagnostics will operate correctly upon installation with minimal pre-programming. Finally, the auto-service sensing capability allows for re-installation of a meter from one electrical service to another without the need to pre-program the change in the type of electrical service supported by the meter.

Figure 21:
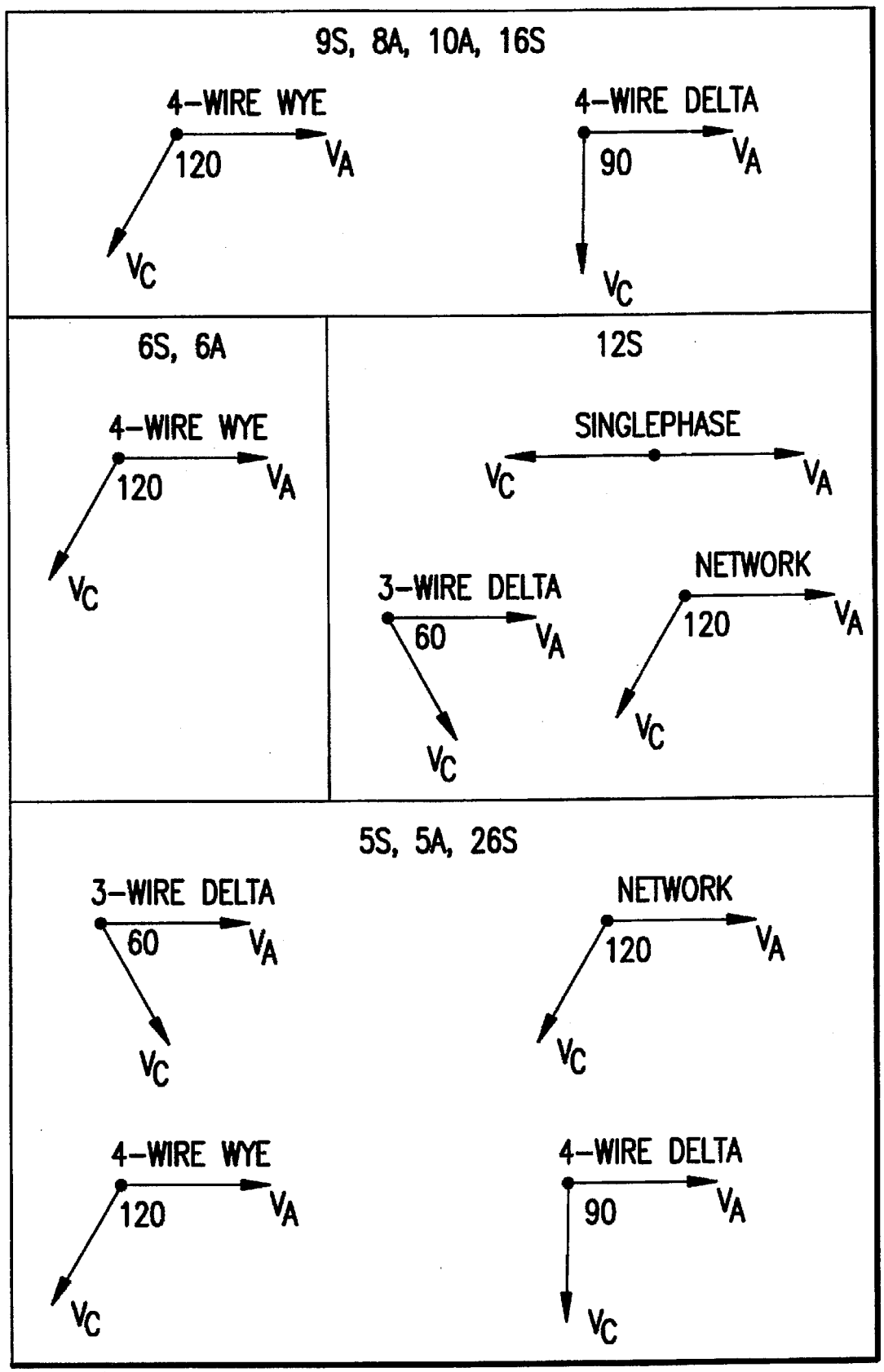
FIG. 21 is a table illustrating the meter form factors and the associated types of electrical services which they may support.

Referring to FIG. 21, in one embodiment, the system includes an automatic electrical service Sensing capability for those meters which have been pre-programmed as forms 5S, 6S, 9S, 12S, 16S, 26S, 5A, 6A, 8A, and 10A. Each of the different services within one of the form groups shown in FIG. 19 has a unique balanced resistance load phasor diagram which shows the angular location of each of the individual phase current and voltages with respect to A phase voltage. In a real world application, the current phasors will be removed from these balanced resistance load locations because of varying loads. However, the voltage phasors do not vary with load and should be within one or two degrees of their balanced resistive load locations. Since the B phase voltage phasor will not be present on the two element meters, nor on the 6S (6A) meter, this voltage is contrived. However, the phase C voltage phasor is present on all of the different forms and services and is measured with respect to the phase A voltage. Thus, for the form meters identified in FIG. 21, a check of the phase C voltage phasors angular location relative to the A voltage phasor will alone provide the information necessary to determine what service the meter is in.

The lone exception to this rule is that network and four-wire WYE service cannot be distinguished on the 5S, 5A, 26S form group by simply examining the phase C and phase A voltage phasor locations. In the embodiment of the system described herein, the system simply assumes a four-wire WYE service under these conditions.

Thus, as shown in FIG. 21, if the form factor of the meter is known, the type of electrical service can often be determined by measuring the angular displacement of the voltage factors. In particular, each of meter forms 8A, 10A, 9S and 16S supports the four-wire WYE and four-wire Delta electrical services. Since the displacement of the voltage phasors $V_a$ and $V_c$ in four-wire WYE and four-wire Delta systems is different (120° and 90°, respectively, for an ABC rotation), the system, after a suitable time lag after start-up to ensure valid angular measurements for the phasors calculated by the system, determines the displacement between the $V_A$ and $V_C$ voltage phasors and, based upon that displacement, determines whether the meter is installed in a four-wire WYE or a four-wire Delta system.

Similarly, for meter forms 6S or 6A, the system determines whether the displacement of the $V_a$ and $V_c$ phasors is within an acceptable range from 120°, preferably plus or minus 10°, to ensure that the meter is installed in the appropriate four-wire WYE electrical service which it supports. For 12S meters, the system determines whether the angle of the $V_a$ and $V_c$ phasors is within an acceptable threshold of 60°, 120°, or 180° and, if so, determines that the meter has been installed, respectively, in a three-wire Delta, network, or Single phase electrical service. Finally, for 5S, 5A, and 26S forms, the system examines the $V_a$ and $V_c$ phasors to determine whether their angle falls within acceptable thresholds for each of the three-wire Delta (60°), four-wire Delta (90°), or four-wire WYE (120°) services and, if so, records the corresponding electrical service type.

It should be noted that in the case of the 5S, 5A, and 26S forms, the system cannot distinguish between four-wire WYE and Network services, since the angle between $V_a$ and $V_c$ phasors for both of these services is 120° in the ABC rotation. Since, however, not many utilities currently use the 5S in a Network service, in one embodiment, the system merely assumes that a 120° $V_a/V_c$ angular displacement is a four-wire WYE electrical system. It will be appreciated that if the meter is actually being used in a Network service, the meter will still function correctly despite a determination by the auto-service sensing capability that the meter is installed in a four-wire WYE network. However, since there is a 30° phase shift between current (I) and voltage (V) in the four-wire WYE and since the current and voltage phasors in the Network service are not shifted relative to each other, some diagnostic calculations, such as diagnostics 1 and 4 described herein, may falsely indicate errors if a 5S, 5A or 26S form meter including the above-described automatic electrical service sensing capability is used in a Network service.

It will be appreciated that the system may similarly be implemented to automatically sense the electrical service in which other form meters are installed, either by examining the voltage phasors, and/or other information acquired through the automatic system diagnostics.

It should also be noted that the angular displacements illustrated in FIG. 21 are for ABC sequencing. The system also preferably, checks the $V_a$ and $V_c$ angular displacement values for ABC rotations in making the electrical service determination. It will be appreciated that in a CBA rotation, the phase C voltage phasor, $V_c$, would be 360° minus the $V_c$ location illustrated in FIG. 21.

Figure 22:
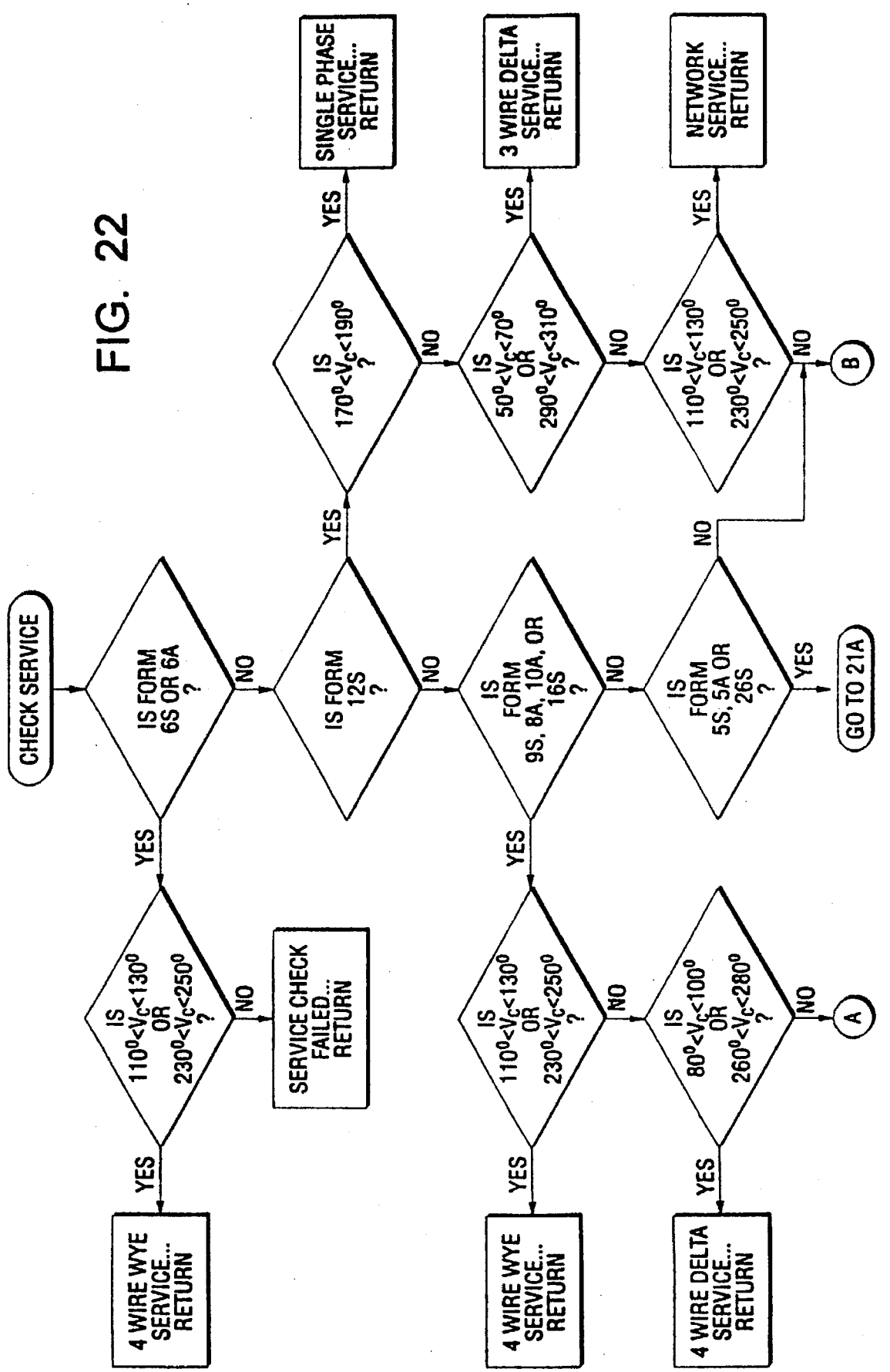
FIG. 22 is a flowchart of a first portion of the automatic service sensing function implemented by the present invention.
Figure 23:
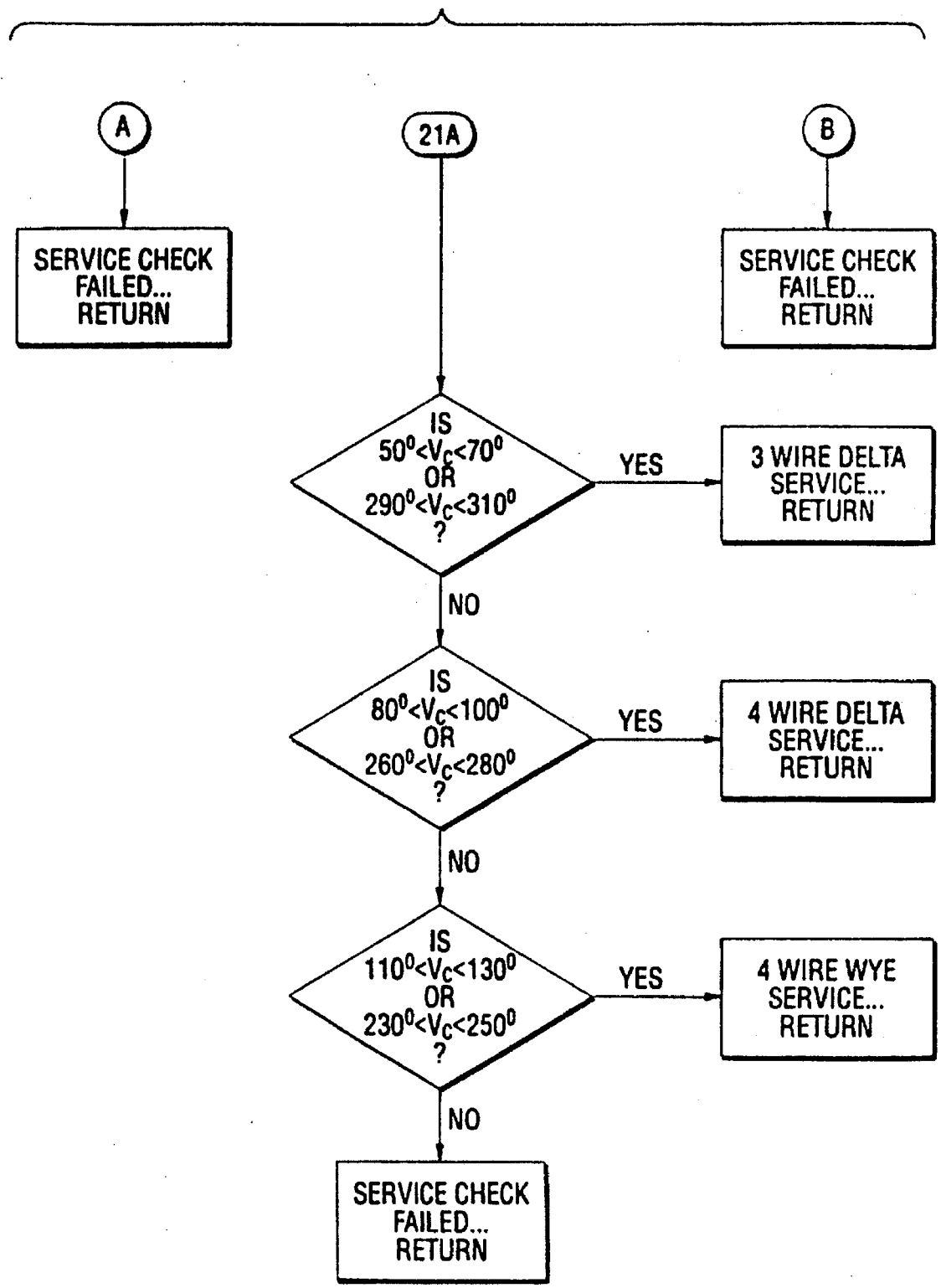
FIG. 23 is a flowchart of a second portion of the automatic service sensing function implemented by the present invention.

FIGS. 22 and 23 illustrate a flowchart of the automatic service checking function employed in one embodiment of the present invention. Each time the meter is powered-up, or whenever the system diagnostics are reconfigured, the meter will perform the system checking service function. This may be triggered by initializing the service type to an invalid value. The system, on start-up, or reconfiguration after, for example, a power outage, will then recognize the invalid value and automatically begin determination of a valid service type.

A diagnostic delay is set for a predetermined period, preferably about 8 seconds for a meter operating at 60 Hz, to allow the meter to settle and for valid angular measurements for the five possible phasors to be calculated. The automatic service sensing function does not, therefore, execute while this delay is active, since the $V_a$ and $V_c$ phasor values may be unreliable. After lapse of the diagnostic delay period, the automatic service sensing function is activated at the end of each sample interval (one second for 60 Hz) until a valid service is found. If a valid service is not found and any diagnostics have been enabled in the system, the failure to determine a valid service will be recorded as a diagnostic #1 failure. If no diagnostics are enabled, the invalid service error will not be recorded. In one embodiment of the system employing the automatic service sensing function, the diagnostic #1 error for an invalid service is not reported on the display unless diagnostic #1 is enabled to scroll or lock as described herein.

As long as a valid service is not found, the diagnostics will not be checked. Once a valid service is determined, the type of services recorded in the system, the automatic service sensing ceases, and the meter begins doing diagnostic checks during each sample interval, as described hereinafter, for those system diagnostics which have been enabled.

It should be noted that in one embodiment of the present invention, the operation of the diagnostic #1 failure when a service detection failure occurs is slightly different than the normal diagnostic #1 failure. If the service is not found immediately on the first check, then a diagnostic #1 failure is activated, provided at least one of the system diagnostics capabilities are enabled in the system. As soon as a valid service is found, the diagnostic #1 error will be immediately cleared. The failure will only be displayed on the meter if diagnostic #1 is enabled to scroll or lock. The failure is always recorded on the diagnostic #1 error counter, provided that one of the system diagnostics is enabled. If none of the system diagnostics are enabled, then the failure will not be recorded. This allows the customer an option of shutting off any warning.

It should be noted that, in the implementation shown in FIGS. 22 and 23, the system allows a tolerance, preferably plus or minus 10°, for the location of the voltage phasors in order to pass the diagnostic. This tolerance has been found to be adequate in light of the limited variance of the voltage phasors, typically within one or two degrees of their balanced resistive load locations, in field operation.

User Definition of Diagnostics

The system preferably allows the user to enable or disable the performance of any one or more of the system diagnostics during installation of the meter. If the diagnostics are implemented, the system also provides for user-defined parameters, preferably as described below.

To activate or deactivate any of the above-described diagnostics checks, the user must respond to the following types of prompts in the programming software for each diagnostic check supported by the system:

"DIAGNOSTIC #N DISABLE"

For each "Diagnostic N" (where N represents one of the diagnostic numbers 1–4), the user, upon pressing the return key, gets a menu, preferably including the following options:

Disable

Ignore

Lock

Scroll

The Disable option disables the implementation of that diagnostic.

The Ignore option, if implemented, means that the diagnostic will affect the error condition alert (as hereinafter described), but will not be displayed.

The Lock option, if implemented, will cause the meter display to lock on the diagnostic error message in the event a diagnostic error is determined.

The Scroll option, if implemented, will cause a diagnostic error message to be displayed, when discovered, during the "off time" between each normal mode meter display item.

In addition to the above prompt, the user will be prompted to program the electrical service type (e.g., 4-wire WYE) supported by the particular meter installation.

For Diagnostic #2, the user will also be prompted to program the tolerance for all voltages by inserting a number (preferably corresponding to the percent tolerance) in response to the following prompt:

DIAGNOSTIC #2 PERCENT TOLERANCE: —

For a Diagnostic #3, the user will preferably be prompted to program an acceptable minimum current level in response to the following prompt:

DIAGNOSTIC #3 MINIMUM CURRENT: —

Diagnostic #4 preferably also prompts the user to program the allowable angle difference by inserting a number (1°–90°) in response to the following prompt:

DIAGNOSTIC #4 TOLERANCE ANGLE: —

If either the Lock or Scroll option was selected, the meter will display the following message as soon as a diagnostic error is detected:

Er DIAG N (where N=the Diagnostic #)

Also, the Number of Occurrences of this Error Counter is incremented by one whenever the error is detected. As previously mentioned, however, in the preferred embodiment the system acknowledgement and initial display of a diagnostic error will not occur until the error condition has been present for three consecutive checks. Likewise, the error will not be cleared from the display until it has been absent for two consecutive checks.

Again, depending on how the system is programmed at installation, the display will either lock on the error message, or scroll the error message by displaying it during the "off time" between each normal mode meter display item. Various other error display regimes may be adopted consistent with the teachings of the present invention.

Meter Self-Checks

The system 20 of the present invention is also preferably suitably programmed to periodically perform a series of meter self-checks and, if any errors are detected, the system will record the existence of an error condition, display an error code corresponding to the type of error detected, and, depending upon the type of error, take other suitable action.

The system preferably implements a series of routines which periodically check for fatal errors and non-fatal errors. Errors are classified as fatal where the detected failure may have corrupted billing data or where the detected failure may cause the meter to operate unreliably in the future. The system 20 preferably conducts meter self-checks of the internal RAM of the meter's register module, the ROM of the register module, the EEPROM of the register module, a spurious RESET of the register module, and the internal RAM, ROM and EEPROM of the front-end module. These meter components are preferably checked whenever power is restored to the meter following an outage or otherwise when the meter is reconfigured. If a RAM, ROM, EEPROM, front module processor error, or other fatal error, is detected, the system 20 will display a predetermined error code corresponding to the detected error, lock the display on the error code until the meter is reinitialized, and cease all meter function except communications.

The system 20 checks for a power-down error by determining if the register module processor has encountered a hardware RESET without first going through a predetermined power outage routine. This event may occur, if a transient on the power line asserts the RESET line momentarily. One method of checking for a spurious RESET is to write a special byte to the register EEPROM as the last step in handling an outage. If this special byte is not present on power-up, a spurious RESET has occurred. The system 20 will then display the power-down error code and cease all meter functions except communications.

The system similarly checks for RAM, ROM, EEPROM, and processor failures in the front-end module, as described above. In the embodiment integrated in the meter of FIG. 3, the front-end module will stop communicating with the register module if any front-end module fatal errors are discovered. If the front-end module fails to communicate with the register module for over five seconds, it is presumed that one of these errors has been detected, the front-end processor failure error code is displayed, and the 68HC11 RESET line is asserted until the front-end module resumes normal operation.

The meter self-checks implemented by the system also preferably include a series of non-fatal errors, such as register full scale overflow, system clock, time of use (TOU), mass memory, reverse power flow, and low battery error conditions.

For example, a register full scale overflow error will be reported if the peak Kw register exceeds a pre-programmed register full scale value. If this event is detected, the system displays a register full scale overflow error, which error will be cleared when the meter is reset or when the error is cleared by a predefined programming device.

A clock error will be reported if the minute, hour, date or month data are out of a predefined range. If a clock error occurs, the TOU and mass memory options will be disabled and will cease recording interval data until the meter is reconfigured.

A TOU error will be reported if an internal TOU parameter becomes corrupted and contains a value outside of its predefined accepted range. If a TOU error occurs, the appropriate error code will be displayed and the TOU option will be disabled.

A mass memory error will be reported if an internal mass memory parameter becomes corrupted or is out of its predefined acceptable range. If a mass memory error occurs, the appropriate error code will be displayed and the mass memory option will be disabled.

A reverse power flow error will be reported if the front-end module detects the equivalent of one complete and continuous disk revolution in the reverse direction. This error will be reported regardless of whether energy is detented or undetented.

A low battery error will be reported if the LOBAT signal on the power supply integrated circuit is asserted when its level is checked. If a low battery error is detected, the appropriate error code will be displayed and, as with a clock error, all TOU and mass memory options will be disabled. If the battery is replaced prior to any power outage, the low battery error will be cleared when the battery voltage rises above a predefined threshold value. However, if the battery voltage was below the threshold when a power outage occurred, the meter must be reconfigured to clear this error.

The system also preferably checks for register full scale overflows at the end of each demand interval, and preferably checks for clock, TOU and mass memory errors at power up, 2300 hours, and on any type of meter reconfiguration. The reverse power flow error is preferably checked by the system each second, and the low battery error is checked on power up and once each interval.

In the preferred embodiment of the system 20, the system allows the user to select which of the meter self-checks will be implemented. In the preferred embodiment, if any one of the selected non-fatal errors is detected, the system will display a predetermined error code corresponding to the detected error during the off-time between normal display item. Alternatively, the system may allow for the user to program the system to lock the display on the error code of any nonfatal error, once any such error is detected. In this event, activation of a switch by the user will cause the meter to scroll through the normal display list one time and then lock back on the non-fatal error display.

It should be noted that, in the preferred embodiment, fatal error checks cannot be disabled. If any non-fatal error is not selected, it will not be displayed or flagged.

It will be appreciated by those skilled in the art that various display regimes may be implemented. For example, the system may be programmed to lock the display on the error code corresponding to any non-fatal error detected until a magnetic switch is activated. Upon activation of the magnetic switch, the system may then scroll through its normal display, then lock back on the display of the non-fatal error code. Alternatively, the system could be programmed to continue to scroll through a predefined display list, periodically displaying any and all non-fatal error codes.

Other meter components may similarly be periodically checked using conventional means and assigned error codes which may be displayed when appropriate to alert the user of possible data corruption or unreliable operation of the meter.

Toolbox Mode

The Diagnostics Toolbox is a fixed selected set of display items preferably in the format illustrated in FIG. 14. In the preferred embodiment, the Toolbox display is accessed via a magnetic reed switch which is located at the 12 o'clock position on the meter board, and is activated by keeping a magnet next to the reed switch for at least 5 seconds. This may be accomplished by the user by placing a magnet on top of the meter.

When accessed, the Toolbox display items are each displayed individually as shown and in the sequence indicated in FIG. 14. Once the meter is in Toolbox display mode, it will scroll through all of the Toolbox display items at least one time. When the magnet is removed, the meter will finish scrolling to the end of the Toolbox display list and then revert to Normal mode operation. The TEST annunciator will flash two times per second during the entire time the meter is in Toolbox mode.

All of the #DIAG Error counters are preferably cleared by an external device, such as by a hand-held personal computer, or through normal communications. In the preferred embodiment, the maximum value of each counter is 255.

While the meter is in Toolbox mode, it continues to perform meter operations as usual. This assures that meter operation is not affected even if the magnet is left on top of the meter for an extended period of time. The system continually updates the displayed Toolbox quantities as they change in value during the entire time the meter is in Toolbox mode.

While in Toolbox mode, the Watt Disk Emulator scrolls at the rate of one revolution per 1.33 seconds in the direction of power flow of the phase for which information is being displayed at that point in time. For example, while A phase voltage, current, voltage angle and current angle are being displayed, the Watt Disk Emulator scrolls once per second in the direction of power flow of phase A. As soon as the phase B values (if present) are displayed, the Watt Disk Emulator reverses direction if the power flow in B phase is opposite that of A phase. The Watt Disk Emulator is turned off while the four diagnostic error counters are displayed.

Because continuous potential indication is required by the customer, three potential indicators, preferably labelled $V_A$, $V_B$ and $V_C$, are present on the display. These indicators are "ON" as long as the corresponding voltage is above the predefined threshold. The threshold is preferably defined as 75% of the lowest voltage the meter is rated to operate at. If any voltage drops below the threshold, its indicator will flash, preferably at a rate of two times per second.

When more than one error exists at the same time, the information relating to only one of the errors is displayed, based upon a predefined priority. The following priorities are established in the preferred embodiment of the system:

1. Meter Self-check errors take priority over System and Installation Diagnostic errors.
2. Since only one System and Installation Diagnostic error can be displayed at a time, the highest priority error will be the one that is displayed using a pre-defined priority list.

If two or more System and Installation Diagnostic errors exist, the highest priority error will be the one that is displayed and the one that triggers the output contact closure. If this error is then remedied, the next highest priority error that still exists will then be displayed and will again trigger the output contact closure. The output contact closure (Error Condition Alert) thus remains asserted as long as one or more of the diagnostic errors have been triggered.

As described above and illustrated in FIG. 14, the Toolbox display also preferably displays the instantaneous value of the current and voltage for each phase, and their phase relationship to the voltage on phase A. With this information, the user can construct a phasor diagram which assists in determining the correct installation and operation of the meter. This display also shows the number of diagnostic errors accumulated for each diagnostic since the last time the system was cleared.

Figure 15:
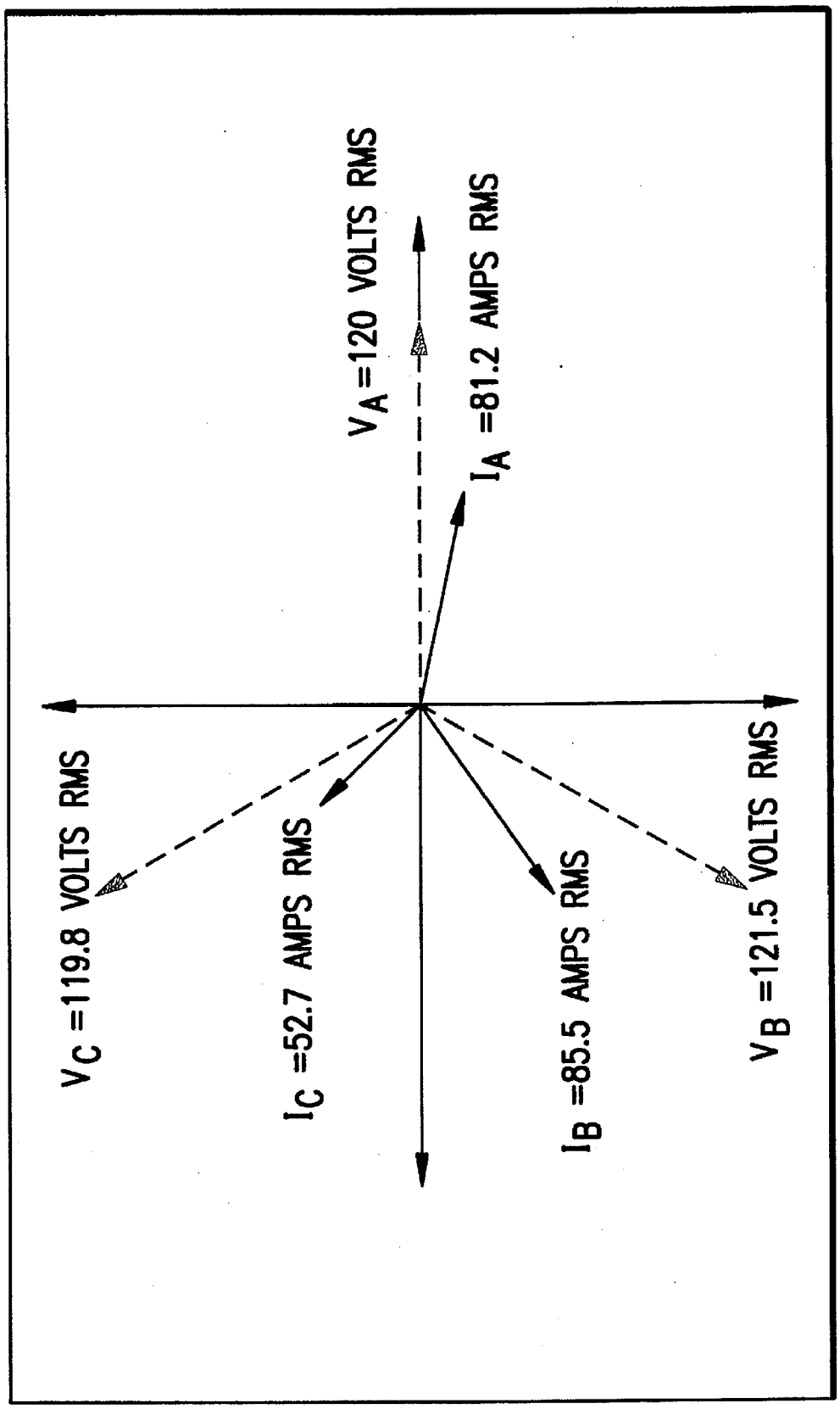
FIG. 15 is a phasor diagram for a typical three-phase meter installation.

An example of the desired relationship between a phasor diagram for a three phase meter installation and a Toolbox display is shown in FIGS. 14 and 15, respectively. With the phase current, voltage and angle information given in the Toolbox display, the user should be able to construct a phasor diagram as shown in FIG. 15. This will allow the user to get a snapshot of the power system status, and to identify any peculiarities or errors. As mentioned before, the Toolbox display will also give the status of the four diagnostic counters which will provide the user with more detailed status information for the system.

Calculation of Phase Angles

In the preferred embodiment, the angle information for phase current and voltages utilized in system Diagnostics #1 and #4, and required for display in the Toolbox display, are determined from accumulated current and voltage values for each phase, as well as the accumulated products, Q and Y (as hereinafter defined). The voltage on phase A is preferably used as the reference (or base phasor) for the other angles. The phase A voltage angle will thus appear as 0.0° in the display. The five other angle values for ($I_A$, $I_B$, $I_C$, $V_B$, $V_C$) will be reported with respect to the voltage on phase A, and will always be given with respect to a lagging reference.

1. The Phase Angle Between $V_A$ and $I_A$

If the Power and Apparent Power are known, the Power Factor can be derived. The relationship is as follows:

$$\text{PowerFactor} = \frac{\text{Power}}{\text{ApparentPower}} = \frac{\text{Power}}{I_{RMS}V_{RMS}}$$

The phase angle (θ) between voltage and current can then be calculated as follows:

θ=arccos (Power Factor)

The device of the present invention can also determine whether the current is leading or lagging the voltage by examining the sign of the reactive power. If the reactive power is positive, then the current is lagging the voltage, and if the reactive power is negative, then the current is leading the voltage.

In the preferred embodiment, the power, RMS voltage, and RMS current are calculated every 60 line cycles for each phase on the meter. This is accomplished by taking 481 samples of the voltage and current over a 60 cycle period. The necessary multiplications and accumulations are done, and then these values are averaged to yield the power, RMS voltage, and RMS current for a given 60 line cycles. These quantities are then used at the end of each 60 line cycle to calculate a power factor for each phase.

The reactive power can be calculated much the same way as the power, except that a 90 degree phase shift must be induced between the current and voltage measurements. This phase shift can be achieved by taking the present current sample and multiplying it by a delayed voltage sample (stored in memory) corresponding to a 90 degree phase shift.

2. Derivation of a Generalized Phase Angle Calculation Method

As demonstrated below, the method of calculating the phase angle of $V_A$ to $I_A$ can be generalized to calculate the angle between any reference phasor (such as $V_A$) and any other phasors (such as $V_B$, $I_B$, $V_{DC}$, or $I_C$).

Figure 16:
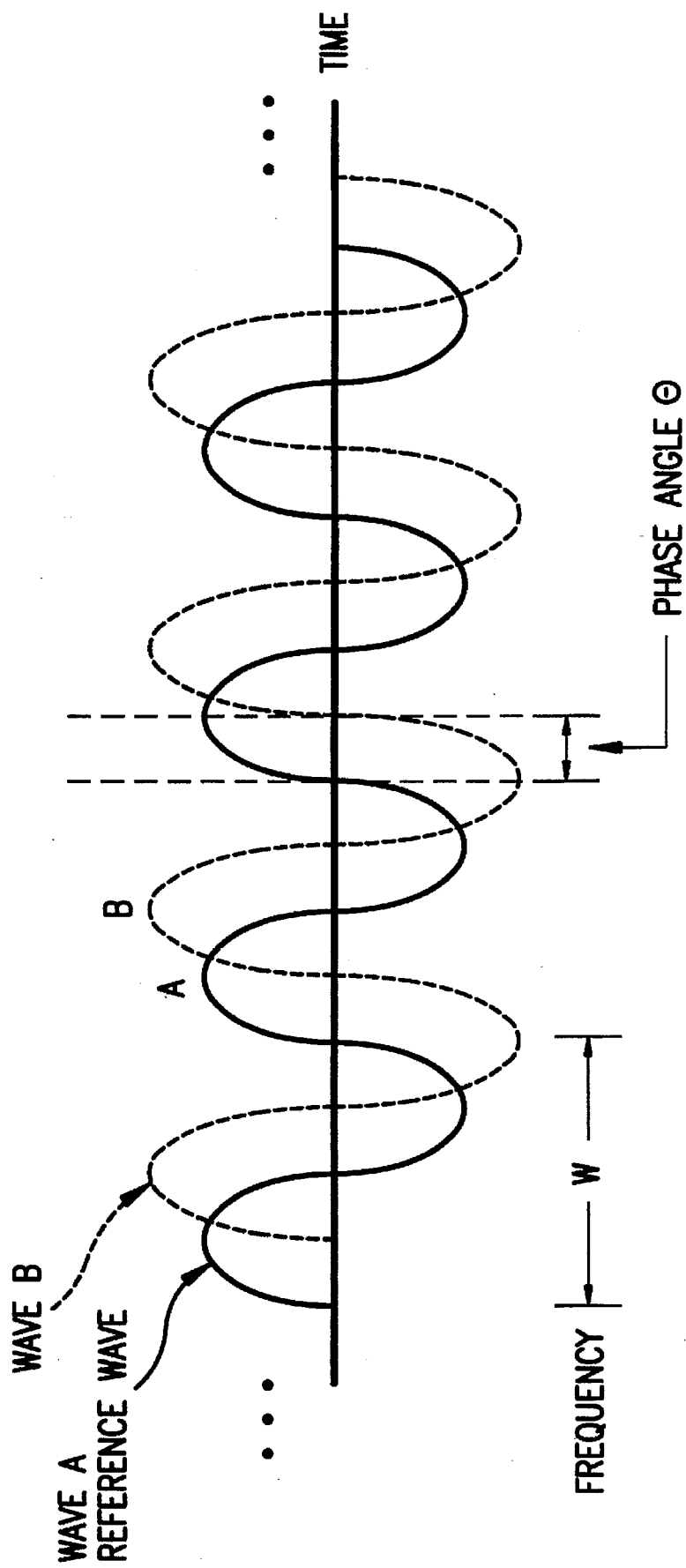
FIG. 16 is a graph illustrating the relationship of the wave forms representing two phase quantities tracked by the system.

Referring now to FIG. 16, consider two sinusoidal waves of the same frequency, different magnitude, and phase shifted one from another as follows:

a(t)=A cos (ωt)

b(t)=B cos (ωt-θ).

By representing the cosine argument as (ωt-θ), the implicit assumption is that θ represents a lagging phase shift from reference a(t) to b(t). The respective position refers to whether b(t) reaches its maximum value before or after a(t) with respect to time. If b(t) reaches a maximum after a(t), then it is said to lag a(t). If b(t) reaches a maximum before a(t), then it is said to lead a(t).

In order to isolate the phase angle θ, the average value of the product of the two sine waves will be evaluated. This average value will be denoted by Q. The equation for the average value is as follows:

$$Q = \frac{1}{T} \int_O^T A\cos(\omega t) B\cos(\omega t - \theta) dt.$$

where A and B represent the amplitudes of sinusoidal waves a(t) and b(t) respectively. The amplitude, $X_{MAX}$, of a sinusoidal wave is related to the RMS value, $X_{RMS}$, by the following relationship $$X_{Max} = \sqrt{2}\ X_{RMS}.$$

Therefore, $$A = \sqrt{2}\ A_{RMS}\ \text{and}\ B = \sqrt{2}\ B_{RMS}.$$

Substituting these relationships into the equation for Q, the equation becomes:

$$Q = A_{RMS} B_{RMS} \cos\theta\ \text{or},$$

$$\cos(\theta) = \frac{Q}{A_{RMS} B_{RMS}}$$

and finally, $$\theta = \arccos\left(\frac{Q}{A_{RMS} B_{RMS}}\right).$$

Therefore, if the average value of the product of two sine waves and the RMS values of the two individual waves is known, then the angle between the two waves can be calculated. This information alone will not allow us to determine whether b(t) is lagging or leading a(t). However, if the sine of the angle θ were known, then whether the angle was a leading or lagging angle could be determined.

In order to determine the sine of the angle, consider the average value of the products of two sinusoidal waves, where a(t) is shifted by 90 degrees or π/2 radians. An expression for the shifted version of a(t) is as follows:

$$\hat{a}(t) = A\cos\left(\omega t - \frac{\pi}{2}\right).$$

The average value of the product of a(t) and b(t) will be referred to as quantity Y. The equation is as follows:

$$Y = \frac{1}{T} \int_O^T A\cos\left(\omega t - \frac{\pi}{2}\right) B\cos(\omega t - \theta) dt.$$

Solving the integral yields the following relationship:

$$Y = \frac{AB}{2} \sin(\theta).$$

Therefore, if the average value of the product of the two sine waves (Q) is known, the average value of the product of the sine waves with the reference wave delay shifted by 90 degrees (Y) is known, and the RMS value for each of the waves is known, then the phase angle can be calculated and a determination made whether the unreferenced wave is lagging or leading the reference wave. The two equations which can be used to determine the magnitude of the phase angles are as follows:

$$\theta = \arccos\left(\frac{Q}{A_{RMS} B_{RMS}}\right)$$

$$\theta = \arcsin\left(\frac{Y}{A_{RMS} B_{RMS}}\right).$$

Whether the angle is leading or lagging can be evaluated by examining the signs of the arccosine and arcsine arguments. Since a positive angle corresponds to a lagging angle, then the following is true for determining whether the angle is leading or lagging:

Arccosine argument (+), arcsine argument (+) —Lagging between 0 and 90 degrees;

Arccosine argument (−), arcsine argument (+) —Lagging between 90 and 180 degrees;

Arccosine argument (−), arcsine argument (−) —Leading between 90 and 180 degrees; and Arccosine argument (+), arcsine argument (−) —Leading between 0 and 90 degrees.

Therefore, if Q, Y, and RMS values for a(t) and b(t) are available then the phase angle between these sinusoidal waves can be determined.

The above-described technique for finding the phase angle will thus apply to any pair of voltages or currents. For instance, to determine the angle between $V_B$ and $V_A$, the two required quantities that will have to be calculated are the average value of the product of two waves ($Q_{VAB}$), and the average value of the product of the two waves with $V_A$ shifted by 90 degrees ($Y_{VAB}$).

As previously mentioned, the meter incorporating the preferred embodiment of the system 20 samples $V_A$ and $V_B$ 481 times every 60 line cycles. If the product of $V_A$ and $V_B$ is calculated for each of the 481 samples and accumulated over a sample interval, then at the end of the sample interval the average value of the product of the two waves, $Q_{VAB}$, can be calculated. The equation for $Q_{VAB}$ is as follows:

$$Q_{VAB} = C \frac{\sum_{n=1}^{481} V_{A(n)} \times V_{B(n)}}{481},$$

where C is a calibration scaling factor used to compensate for the reduction of the phase voltages to a measurable level.

$Y_{VAB}$ can be found in a similar fashion from:

$$Y_{VAB} = C \frac{\sum_{n=1}^{481} V_{A(n-2)} \times V_{B(n)}}{481}$$

where the C for the $Y_{VAB}$ calculation is the same as the C for the $Q_{VAB}$ calculation and $V_{A(n-2)}$ is the voltage $V_A$ two samples previous to the sample, $V_{A(n)}$.

The sampling is designed so that two consecutive samples of a signal are 44.91 degrees apart. Therefore, if the voltage sample from the two samples ago is taken, this will result in a phase shift of 89.82 degrees which is approximately 90 degrees.

It should be noted that instead of using shifting samples of $V_A$, the other quantities could be shifted by 90° to calculate the phase angle. This will result in the same results for the magnitude of the Y value. However, this will change the sign information because the phase angle is shifted by 180°. With this implementation, the following sign relationships between the arcsine and arccosine arguments exists:

Arccos (+), arcsine (−) —Lagging angle between 0 and 90 degrees;

Arccos (−), arcsine (−) —Lagging angle between 90 and 180 degrees;

Arccos (−), arcsine (+) —Leading angle between 90 and 180 degrees; and

Arccos (+), arcsine (+) —Leading angle between 0 and 90 degrees.

If the new values were to be calculated every sample interval for the phase angles needed for the Toolbox display, then the ten product and accumulation terms shown above would have to be calculated every sample interval. Due to the excessive use of processor time and RAM required to accumulate all ten terms every sample interval, only one pair of terms is preferably considered for each sample interval. This limits the use of processor time and RAM, and it makes new phase angle values available for the Toolbox display every five sample intervals.

In the preferred embodiment, the product terms are calculated and accumulated in the following order:

1. First sample interval—$V_A*I_A$ and $V_{A(-90°)}*I_A$ for phase angle $I_A$;
2. Second sample interval—$V_A*I_B$ and $V_{A(-90°)}*I_B$ for phase angle $I_B$;
3. Third sample interval—$V_A*I_C$ and $V_{A(-90°)}*I_C$ for phase angle $I_C$;
4. Fourth sample interval—$V_A*V_B$ and $V_{A(-90°)}*V_B$ for phase angle $V_B$; and
5. Fifth sample interval—$V_A*V_C$ and $V_{A(-90°)}*V_C$ for phase angle $V_C$.

After the fifth sample interval, the sequence begins again, accumulating the necessary Q and Y values for phase angle $I_A$. The samples for $V_A$ are stored during each sample interval. This thus requires that two additional values be stored for $V_A$ at each interval, the two previous $V_A$.

In the preferred embodiment, these functions are implemented in 68HC11 assembly code. The multiplication and accumulation of these product terms occurs in the front-end sampling interrupt routine. The voltage values are 8-bit values and the current values are 12-bit values. Since $V_A$ is always involved in any of the multiplications, this will mean some of the multiplies will be 8×8 bit and some will be 8×12 bit. Since it is desirable to use the same algorithm to do all the multiplications, the 8-bit values are extended to 12-bit values such that an 8×12 bit multiplication algorithm is used exclusively in the preferred embodiment.

The 8-bit voltage values for $V_B$ and $V_C$ are sign extended to 12-bit values so that all the multiplication and accumulation of product terms for finding the phase angles are handled by two algorithms, one for the accumulation of product terms for the Y value and one for the accumulation of product terms of the Q value. The sign extension of voltage values $V_B$ and $V_C$ are performed during every sample period. This makes special checks unnecessary for identifying the sample intervals in which these quantities are needed, because they are available during every sample interval.

All 12-bit values for current and voltages are preferably stored in 16-bit registers in the memory, because the memory is segmented into byte boundaries.

The front-end sampling routine must have a way of identifying which product term is to be calculated at each sample interval. A counter identifier is preferably utilized as an index to access the correct value for the multiplications necessary in the accumulation of the Q and Y values.

In order to accumulate the two product terms, two accumulators are set aside in the memory map. The size of each of these accumulators is the same, since both are doing 8×12 bit multiplies. The largest possible accumulated value is as follows:

Largest 8 bit value=128

Largest 12 bit value=2048

Largest accumulated result=481*128*2048=07 84 00 00 (hex)

Therefore, each accumulator is four bytes long to accommodate the worst case result. Two four-byte accumulators are therefore set aside to accumulate each pair of product terms for each sample interval.

At the end of each sample interval, the results in the two four-byte accumulators are stored in two four-byte holding areas to await processing by the background routines necessary in completing the angle calculation during the next interval.

Once the accumulated pairs have been transferred to the holding registers at the end of a sample interval, then the remaining calculations needed to determine the phase angle take place during the next sampling interval in the background, while the accumulation for the next pair is taking place in the foreground. These background routines must also have a way of determining on which pair of accumulated product terms they are working. A separate counter identifier is used for these background routines which operates in a similar fashion to the counter identifier for the front-end sampling interrupt. However, it is possible to use the same counter, since this identifier will always be one count behind the counter identifier for the front-end module sampling interrupt routine.

The meter 34 illustrated in FIGS. 2, 3, 17A–B and 18A–B, into which the system 20 of the present invention is preferably integrated, is a solid state single function KW/Kwh meter utilizing digital sampling techniques to provide conventional Kw/Kwh demand, time of use, and other conventional real time billing information in addition to the diagnostic information generated by the system 20 of the present invention. The meter 34 is preferably programmed using software that runs on an IBM compatible personal computer using the MS-DOS operating system. This software includes the logic for prompting the user to provide meter configuration parameters and preferably includes the installation prompts which provide for user-defined parameters for the diagnostics supported by the system 20 of the present invention, so that a hand-held personal computer can be plugged into a communications port on the meter to program the meter at installation.

Figure 17A:
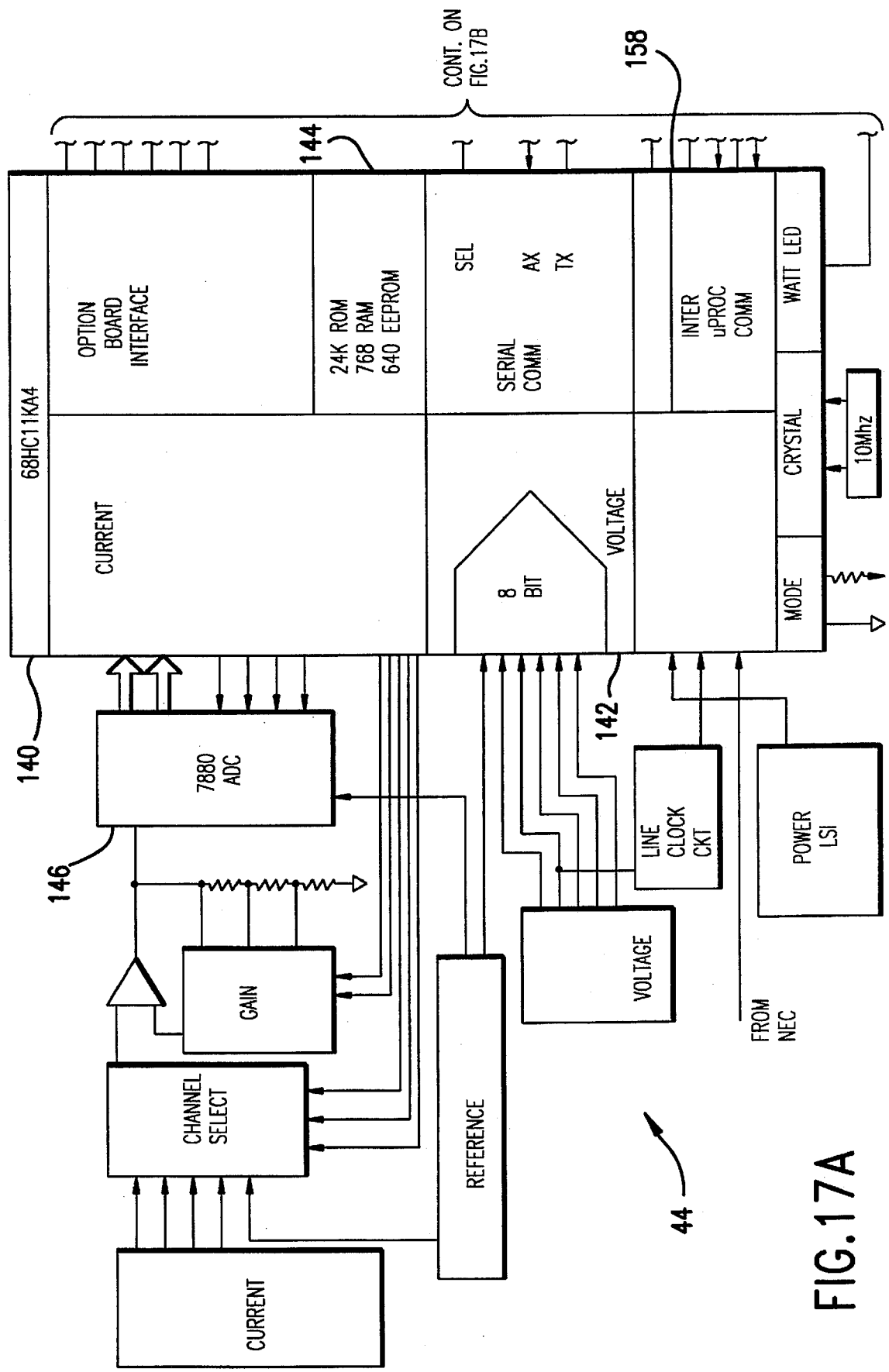
FIG. 17A is the first portion of a block schematic of the front-end module 42 of FIG. 3.
Figure 17B:
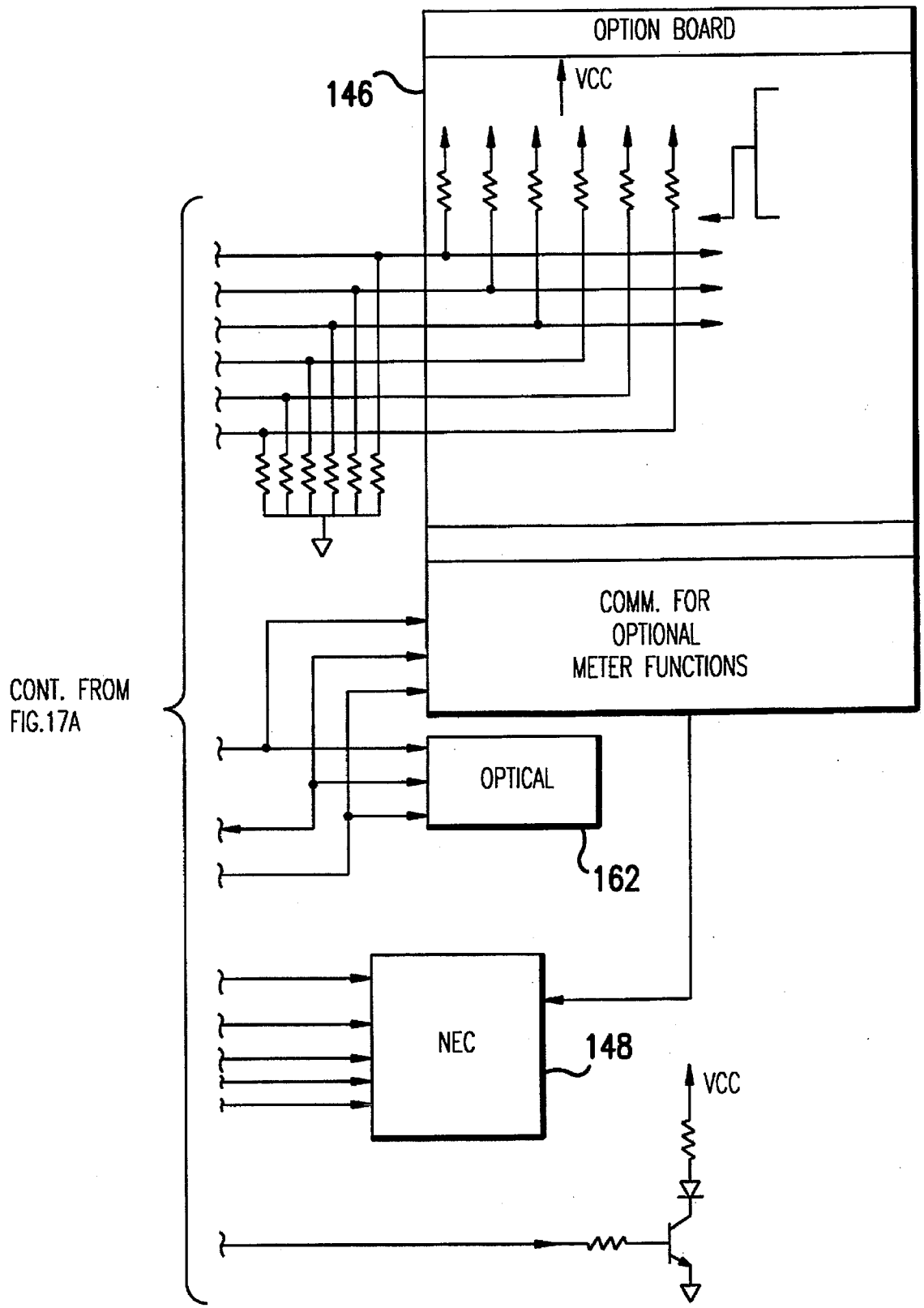
FIG. 17B is the second portion of a block schematic of the front-end module 42 of FIG. 3.

FIGS. 17A–B illustrate the front-end module 44 of the meter 34 into which the system 20 of the present invention is preferably incorporated. The front-end module 44 preferably includes a Motorola MC68HC11KA4 microprocessor 140 running in single chip mode, an integral 8-bit A/D converter 142, which serves as the voltage converter 26 in the system 20 of the present invention, 24K bytes read only memory (ROM), 640 bytes electrically erasable programmable read only memory (EEPROM), and 768 bytes random access memory (RAM), all shown at 144. The ROM and EEPROM include the diagnostic logic, and the RAM serves as storage memory for the present invention. An external 12 bit A/D converter, shown at 146 serves as the current A/D converter 28 for the system 20 of the present invention.

An additional error condition alert function may be implemented as an option on the front-end module 44. This function utilizes a line out to, for example, an external communication device, which can be activated whenever an error condition is determined. This optional function may be utilized by the system 20 of the present invention for activating and communicating the existence of error conditions for any one of the diagnostics performed by the system 20 of the present invention.

An option board 146 may be incorporated into the front-end module 44 to provide various signals to the outside world. For example, the error condition alert may be assigned to a low current solid-state or Mercury-wetted relay to indicate when one or more diagnostic errors have been determined. Other known ancillary functions, such as automated meter reading or real time billing, may be implemented on option board 146, or on a similarly configured option board utilized with the front-end module 44.

Figure 18A:
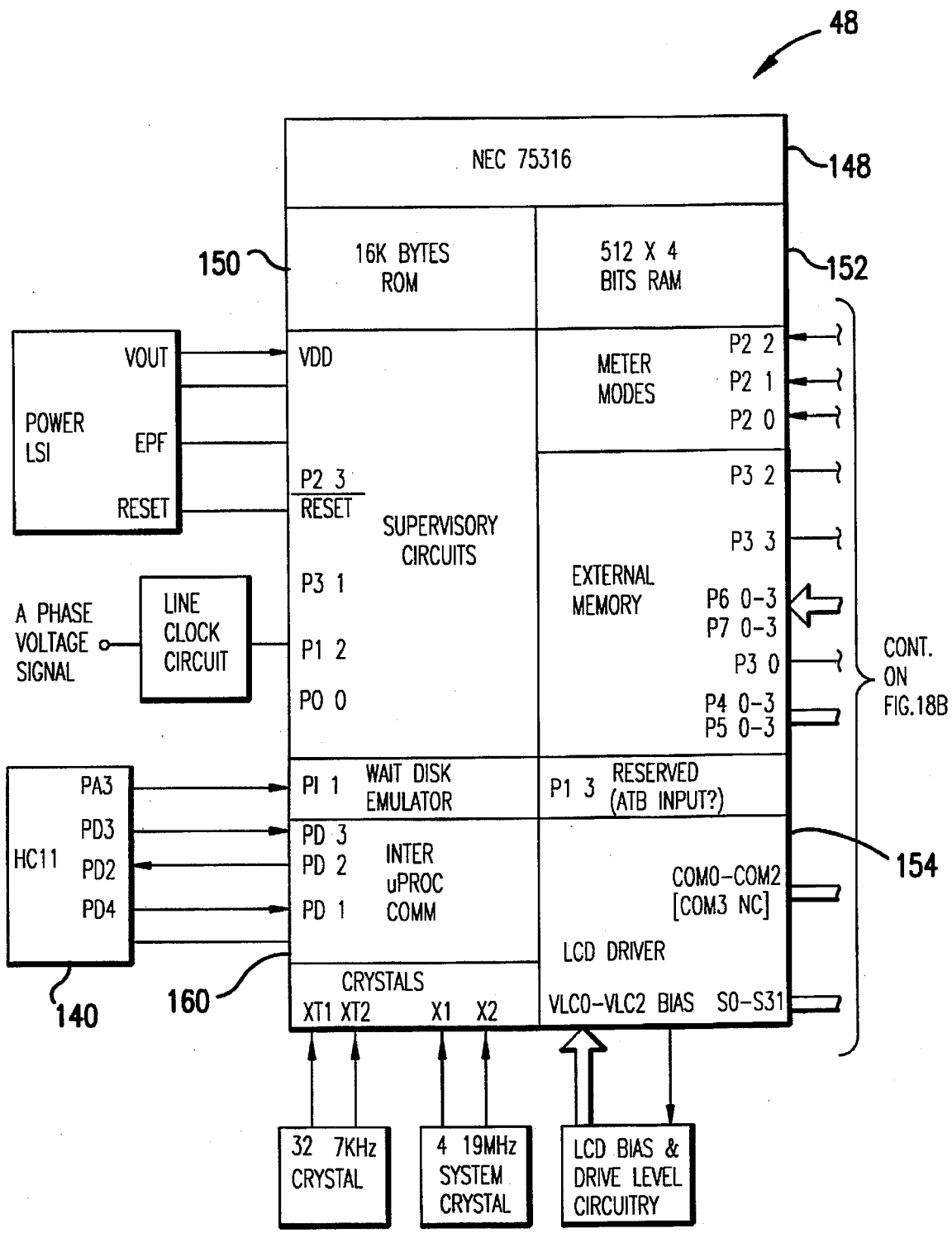
FIG. 18A is the first portion of a block schematic of the register module 48 of FIG. 3.

Referring now to FIGS. 18A–B, the register module 48 of the meter 34 into which the system 20 of the present invention is preferably incorporated, includes a NECuPD75316GF single chip microprocessor 148, including 16K bytes of ROM, shown at 150, 512×4 bits of RAM, shown at 152, and a 96 segment LCD display driver 154, suitable for driving an LCD display 156 such as the particular type of display 33 shown in FIG. 3 and utilized in the preferred embodiment of the meter 34.

Serial data will be transferred between the front-end module 44 and the register module 48 via a four wire synchronous serial data link shown respectively at 158 in FIGS. 17A–B and 160 in FIGS. 18A–B. The front-end module will monitor and update the status of all of the diagnostics performed by the system 20 of the present invention and, periodically (preferably once per second) communicate these statuses to the register module 48 via the above-described serial communications link for display, as well as for storage of volatile data in the event of a power outage. In addition, any instantaneous quantity required for display in the Toolbox display of the present invention, will be communicated by the front-end module as needed to the register module. The front-end module 44 also communicates various other conventional meter information to the register module 48, such as the amount of energy (in Kwh) registered for the past 60 line cycles, as well as its direction (delivered or received), present demand and end-of-interval information.

Information which may be communicated from the register module 48 to the front-end module 44, typically includes periodic meter register status information.

Referring again to FIGS. 17A–B, the front-end module 44 enables the measurement of per-phase voltage, current and watts for one sample interval (60 line cycles). As previously described, the front-end module preferably performs 481 samples per 60 line cycles, which corresponds to 481 Hz when the line frequency is 60 Hz, and approximately 401 Hz when the line frequency is 50 Hz. The sampling frequency is recalculated every 60 cycles, based on the measured line frequency. As previously described, the diagnostic functions of the present invention, including determination of instantaneous per-phase current, voltage, watts and phase angle, are preferably performed by the front-end module 44 when the system is incorporated in a meter of the type shown in FIG. 3.

Referring again to FIGS. 3 and 18A–B, the register module 48 preferably performs the function of driving the LCD display 33 in the meter 34. As previously described, the Toolbox display of the present invention may be implemented by activating an alternate display switch (not shown) for a predefined period. When activated, the Toolbox display mode is activated and the display will scroll through the Toolbox display list as previously described herein. During a Toolbox display, the "TEST" icon preferably flashes continuously, and the watt disk emulator, shown as the five rectangular icons at the bottom of the display 33, will scroll at a rate of about one revolution per 1.33 seconds. The direction of the watt disk emulator will be the same as the direction of power flow for the phase being displayed (left to right if received, right to left if delivered). The meter will leave the Toolbox display mode when the end of the display is reached and the alternate display switch is no longer activated. It should be noted, as previously described, the meter will continue to perform all normal mode meter operations while the Toolbox display sequence is active.

When the alternate display switch is not activated, the meter display 33 operates in normal display mode for the meter 34.

Communication to or from the meter may also be accomplished through the front-end module 44 via connection to the optical port 162.

Thus, the integral electronic meter system diagnostic package of the present invention provides the capability for continuous self-checking of the internal components of the meter, as well as alert field personnel to any discovered error, without interruption of the meter's operation. The system also provides the capability for constant system diagnostic checks, and display of those diagnostic results, to provide pertinent diagnostic data to system personnel during or following installation of the meter.

The system provides the flexibility of allowing the user to program the system to select and define the functions and parameters suitable to the particular service supported by the meter installation.

Finally, the Toolbox display capability of the present invention allows for periodic display of valuable information respecting the internal functioning of the meter as well as the character of the service supported by the meter, again without interruption of normal service and meter operation.

While the best mode for carrying out the invention has been described in detail, those familiar with the art to which this invention relates will recognize various alternative designs and embodiments for practicing the invention as defined by the following claims.

What is claimed is:

1. An electronic meter checking an electrical system diagnostics package including:
 a microprocessor;
 storage memory suitably connected to the microprocessor;
 logic for automatically periodically performing a preselected test of meter checks and recording any errors detected therefrom;

logic for automatically periodically performing a preselected series of system diagnostics tests and recording any results which exceed predefined thresholds;

display means for displaying error messages identifying one or more errors discovered as a result of the meter checks performed during a predefined period; and display means for displaying diagnostic messages identifying any errors discovered as a result of the system diagnostics tests performed during a predefined period.

2. The system of claim 1 further including logic for automatically determining the type of electrical service in which the meter is installed.

3. The system of claim 2 wherein the logic for automatically determining the type of electrical service in which the meter is installed performs such determination during initialization of the meter upon installation of the meter.

4. The system of claim 3 wherein the logic for automatically determining the electrical service in which the meter is installed performs such determination upon reconfiguration of the meter.

5. The system of claim 2 wherein the logic for determining the electrical service in which the meter is installed automatically periodically performs such determination during normal operation of the meter.

6. An electronic meter system checking and troubleshooting package for ascertaining voltage information from a polyphase electrical system metered thereby, including:

(a) a microprocessor;

(b) storage memory suitably connected to said microprocessor and (c) logic for automatically determining the type of polyphase electrical system in which a meter including the system checking and troubleshooting package is installed.

7. The system of claim 6, further including logic for ascertaining voltage information from the polyphase electrical system metered thereby.

8. The system of claim 7, wherein said logic for ascertaining voltage information from the polyphase electrical system metered thereby includes logic for determining the phase angle of at least one voltage phasor of the polyphase electrical system metered thereby relative to a selected base voltage phasor, and wherein the logic for automatically determining the type of polyphase electrical system in which the meter including the system checking and troubleshooting package is installed includes logic for comparing the voltage phase angle of the at least one phasor relative to the selected base phasor to a set of preselected voltage phasor angles for different possible types of electrical services, and determining the type of electrical service, if any, as a function of the voltage phasor angle.

9. The system of claim 8 wherein the logic for determining the type of electrical service makes such determination on the basis of the angle between the C phase voltage phasor, $V_c$, and the A phase voltage phasor, $V_a$, as well as the predefined form factor of the meter.

10. The system of claim 9 wherein the logic for determining the phase angle of at least one phasor relative to a selected base phasor includes logic for storing accumulated digital values corresponding to the instantaneous voltage measured for the base phasor $X_B$, storing the accumulated digital values corresponding to the instantaneous value measured for another selected phasor, $X_N$, determining, for a predefined period, the RMS values for $X_B$ and $X_N$, denoted $X_{B(RMS)}$ and $X_{N(RMS)}$, respectively, determining the product, P, of $X_{B(RMS)}$ and $X_{N(RMS)}$, determining the average value, Q, of the product of the two sine waves corresponding to $X_B$ and $X_N$, and determining the average value, Y, of the product of the two sine waves corresponding to a shifted version of $X_B$, denoted $X_{B(-90)}$.

11. The system of claim 10 wherein the logic further includes logic for determining the magnitude of the phase angle of one phasor relative to the selected base phasor, θ, equal to arccos (Q/P).

12. The system of claim 11 wherein the base phasor, $X_B$, is the A phase voltage phasor, and wherein the other selected phasor, $X_N$, is the C phase voltage phasor.

* * * * *